US006898105B2

United States Patent
Sakai et al.

(10) Patent No.: US 6,898,105 B2
(45) Date of Patent: May 24, 2005

(54) FERROELECTRIC NON-VOLATILE MEMORY DEVICE HAVING INTEGRAL CAPACITOR AND GATE ELECTRODE, AND DRIVING METHOD OF A FERROELECTRIC NON-VOLATILE MEMORY DEVICE

(75) Inventors: Shigeki Sakai, Tsukuba (JP); Kazuo Sakamaki, Nasu-gun (JP)

(73) Assignees: National Institute of Advanced Industrial Science and Technology, Tokyo (JP); Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 10/453,441

(22) Filed: Jun. 3, 2003

(65) Prior Publication Data

US 2003/0235067 A1 Dec. 25, 2003

(30) Foreign Application Priority Data

Jun. 19, 2002 (JP) ........................................ 2002-178264

(51) Int. Cl.[7] ..................... G11C 11/22; G11C 11/24
(52) U.S. Cl. ........................................ 365/145; 365/149
(58) Field of Search ................................. 365/145, 149, 365/198.04, 218, 185.01, 189.04

(56) References Cited

FOREIGN PATENT DOCUMENTS

| JP | 07-202138 | 8/1995 |
|---|---|---|
| JP | 9-139472 | 5/1997 |
| JP | 10-064255 | 3/1998 |
| JP | 2800746 | 7/1998 |
| JP | 11-097559 | 4/1999 |
| JP | 2000-349251 | 12/2000 |

Primary Examiner—Thong Q. Le
(74) Attorney, Agent, or Firm—Jordan and Hamburg LLP

(57) ABSTRACT

A ferroelectric non-volatile memory device that allows the coupling ratio to be increased and the effect of voltage distribution to the ferroelectric capacitor to be improved without increasing the area of the gate electrode of a detection MIS field effect transistor is provided. In a memory cell structure, a semiconductor including regions for a source, a channel, and a drain, a gate insulator on the channel region, a floating gate conductor, a ferroelectrics, and an upper electrode conductor are layered in this order. The structure includes a paraelectric capacitor having one end connected to the floating gate conductor and the other end connected to the source region.

16 Claims, 12 Drawing Sheets

FIG.5

|       | WRITING | ERASURE | READING |
|-------|---------|---------|---------|
| WL1   | Vp      | Vp      | 0       |
| RL1-1 | 0       | 0       | Vp      |
| RL1-2 | Vp      | Vp      | Vp      |
| WL2   | 0       | 0       | 0       |
| RL2-1 | 0       | 0       | 0       |
| RL2-2 | 0       | 0       | 0       |
| BL1   | Vp      | 0       | Vd      |
| SL1   | 0       | Vp      | 0       |
| BL2   | 0       | 0       | 0       |
| SL2   | 0       | 0       | 0       |

PRIOR ART

PRIOR ART

PRIOR ART

FERROELECTRIC NON-VOLATILE MEMORY DEVICE HAVING INTEGRAL CAPACITOR AND GATE ELECTRODE, AND DRIVING METHOD OF A FERROELECTRIC NON-VOLATILE MEMORY DEVICE

BACKGROUND OF THE INVENTION

1. Field of the Invention

The present invention relates to a ferroelectric non-volatile memory device including non-destructive reading, transistor type ferroelectric memory cells arranged in a matrix of rows and columns and having a ferroelectrics for each control gate, and a driving method thereof.

2. Description of the Related Art

One such conventional non-destructive reading, ferroelectric non-volatile memory device is an MFMIS (Metal Ferroelectric Metal Insulator Semiconductor)-FET (Field Effect Transistor) 104 as shown in FIG. 13. In the MFMIS-FET 104, an MIS (Metal Insulator Semiconductor) field effect transistor 101 is formed on a semiconductor substrate 100, and a gate electrode (floating gate electrode) 102 on the gate insulator 109 of the transistor 101 is connected in series with a ferroelectric capacitor Cf including a ferroelectric thin film 103 made of for example PZT ($PbZrTiO_3$) or SBT ($SrBi_2Ta_2O_9$) and an upper electrode 105.

FIG. 14 is an equivalent circuit diagram of the MFMIS-FET 104 shown in FIG. 13. Voltage V applied across the area between the upper electrode 105 of the ferroelectric capacitor Cf and the semiconductor substrate 100 is distributed into distribution voltage $Vf=V(Ci/(Ci+Cf))$ and distribution voltage $Vi=V(Cf/(Ci+Cf))$ in inverse proportion to the ratio between the ferroelectric capacitance Cf and the gate capacitance Ci between the gate electrode 102 and the semiconductor 100 and applied to the capacitors Cf and Ci. The ferroelectric thin film 103 is polarized by the distribution voltage $Vf=V(Ci/(Ci+Cf))$ applied to the ferroelectric capacitor Cf. The threshold voltage for the MIS field effect transistor 101 is changed depending upon the direction of polarization, which changes the resistance across the channel 108 between the source 106 and the drain 107, so that data represented as the polarization of the ferroelectric thin film 103 is read in the terms of change in the drain current value passed across the channel 108.

According to the method, the residual polarization of the ferroelectric thin film 103 is maintained in order to hold the data, in other words, to maintain the on or off state of the MFMIS-FET 104. Therefore, the device is non-volatile and non-destructive reading is allowed, in other words, data is not destroyed at the time of reading.

The voltage $Vf=V(Ci/(Ci+Cf))$ distributed to the ferroelectric capacitor Cf depends on the coupling ratio $(Ci/(Ci+Cf))$ between the capacitance Cf of the ferroelectric capacitor and the capacitance Ci of the gate insulator capacitor. In general, the dielectric constant of the ferroelectric thin film 103 is larger than that of the gate insulator 109, and therefore the capacitance Cf of the ferroelectric capacitor is greater than the gate capacitance Ci for the same area. The voltage V applied across the area between the upper electrode 105 and the substrate 100 is mostly distributed as the distribution voltage $Vi=V(Cf/(Ci+Cf))$ to the gate capacitor Ci, while the ferroelectric capacitor Cf is provided only with low distribution voltage $Vf=V(Ci/(Ci+Cf))$. When the electric field caused at the ferroelectric thin film by the voltage Vf is not more than the coercive electric field, sufficient polarization inversion is not caused, and therefore the device does not function as a memory.

An MFMIS-FET 110 as shown in FIG. 15 has been suggested in order to distribute a larger share of voltage to the ferroelectric capacitor Cf. In the shown configuration, the area of the gate electrode 102 of the MIS field effect transistor 101 is larger than that of the ferroelectric thin film 103 and the upper electrode 105 of the ferroelectric capacitor Cf. FIG. 16 is an equivalent circuit diagram of FIG. 15. In this configuration, the coupling ratio $(Ci/(Ci+Cf))$ is large, and therefore the distribution voltage $Vf=V(Ci/(Ci+Cf))$ applied to the ferroelectric capacitor Cf can be larger. Consequently, the increased distribution voltage Vf reinforces the polarization, so that the polarization holding capability, in other words, the data holding capability improves.

FIG. 17 is a diagram of the configuration of a ferroelectric non-volatile memory device including four memory cells C11, C12, C21, and C22 each identical to the conventional MFMIS-FET described above and shown in FIG. 14 arranged in a matrix of two rows and two columns on a common semiconductor substrate. Note however that in reality the matrix is made of m rows and n columns altogether (m, n: an integer not less than 2). In the conventional circuit configuration shown in FIG. 17, word lines WL1, WL2, . . . , and WLm (not shown) in the horizontal direction in the figure (hereinafter as "the row direction") are each connected with the upper electrodes of all the MFMIS-FET memory cells in each corresponding row among cells C11, C12, . . . , C1n (not shown), C21, C22, . . . , C2n (not shown), . . . , Cm1 (not shown), . . . , and Cmn (not shown). Meanwhile, bit lines BL1, BL2, . . . , and BLn (not shown) and source lines SL1, SL2 . . . , and SLn (not shown) in the vertical direction in the figure (hereinafter as "the column direction") are connected with the drains and the sources, respectively of all the MFMIS-FET memory cells in each corresponding column among the cells C11, C21, . . . , Cm1 (not shown), C12, C22, . . . , Cm2 (not shown), . . . , C1n (not shown), . . . , and Cmn (not shown).

The word lines WL1, WL2, . . . , and WLm (not shown), the bit lines BL1, BL2, . . . , and BLn (not shown) and the source lines SL1, SL2, . . . , and SLn (not shown) are selected by a selection circuit that is not shown.

In the conventional circuit configuration described above, at the time of data writing, a word line WLi and a bit line BLj and/or a source line SLj connected to a memory cell Cij to which data is to be written is selected. At the time of data reading, a word line WLi, a bit line BLj, and a source line SLj connected to a cell Cij from which data is to be read are selected. At the time of data erasure, a word line WLi, a bit line BLj, and/or a source line SLj connected to a memory cell Cij from which data is to be erased are selected. The selected word line Wij, bit line BLj, and source line SLj are provided with prescribed voltage, so that data is written, read and erased. The MFMIS-FET in FIG. 16 may be similarly used in place of the conventional MFMIS-FET as shown in FIG. 17.

In the conventional circuit configuration shown in FIG. 17, since the word line WLi is connected in common with all the memory cells in the row, prescribed voltage for writing, reading or erasure is applied at the same time to the cells other than the memory cell selected for the writing, reading, and erasure. The bit line BLj and the source line SLj are similarly connected in common to all the memory cells in the column, and prescribed voltage for writing, reading or erasure is applied to the memory cells other than the memory cell selected for the writing, reading, or erasure. Therefore, the device is encountered with the following disadvantages.

(1) At the time of data writing, when the word line WLi connected to the memory cell Cij to which data is to be written is selected, writing voltage is applied from the word line WLi to all the memory cells connected to the word lines WLi, and data is written in the memory cells. The memory cell for writing cannot be selected.

(2) At the time of data erasure, the word line WLi connected to the memory cell Cij whose data is to be erased is selected, erasure voltage from the word line WLi is applied to all the memory cells connected to the word line WLi and data in the memory cells is rewritten. Therefore, the memory cell cannot be selected.

(3) At the time of data reading, when the bit line BLj and the source line SLj connected to the memory cell Cij from which data is to be read out are selected, and non-selected memory cells connected to the bit line BLj and the source line SLj are in an on state, current is passed between the bit line BLj and the source line SLj through the non-selected cells. This makes it difficult to determine the on/off state of the selected memory cell Cij.

(4) At the time of reading, when voltage is applied to the word line WLi connected to the memory cell Cij from which data is to be read out in order to select the cell, unwanted voltage is applied to non-selected memory cells similarly connected to the word line WLi, and data in the non-selected memory cells is destroyed.

(5) Negative (−) voltage is necessary in addition to positive (+) voltage in order to invert the polarization. In this case, an additional negative voltage generation circuit or negative voltage generation means provided outside the chip is necessary, which increases the chip area or the number of necessary parts.

In order to solve these disadvantages, there is a known method disclosed by JP-A No. 10-64255 (Japanese laid-open patent application) entitled "Method for Writing Data to Single Transistor Type Dielectric Memory." According to the method disclosed by this document, when voltage V is applied to a selected memory cell at the time of writing, voltage ±V/3 is applied to non-selected memory cells. According to this conventional method, however, the disadvantage (5) cannot be solved, and when voltage continues to be applied to non-selected memory cells in the direction to invert the polarization, the polarization is inverted, which could give rise to eventual re-writing with wrong data.

Another conventional method disclosed by JP-A No. 11-97559 entitled "Ferroelectric Memory Cell, Method for Driving the Same and Memory Device" also suffers from the same problem.

Meanwhile, as described in conjunction with FIGS. 15 and 16, according to the conventional method, in order to distribute necessary distribution voltage Vf to the ferroelectric capacitor Cf, the coupling ratio (Ci/(Ci+Cf)) between the capacitance Cf of the ferroelectric capacitor and the capacitance Ci of the gate insulator capacitor should be increased. One method to increase the ratio may be to increase the thickness of the ferroelectric capacitor Cf and another method may be to reduce the electrode area. According to the former method, the voltage to be distributed to the ferroelectrics increases, but the electric field is reduced for the increase in the film thickness. According to the latter method, it would be extremely difficult to secure a registration margin when contact holes for Al electrode interconnection to the upper electrode of the ferroelectric capacitor are formed. Alternatively, a gate insulating film for the gate insulator capacitor Ci may be reduced in thickness, or the gate area may be increased. The former method can however increase current leakage or lower breakdown voltage. The latter method restricts flexibility in designing the circuit of the data detection MIS field effect transistor 101. This is not preferable in terms of designing and producing the data detection MIS field effect transistor 101.

Japanese Patent No. 2,800,745 and JP-A Nos. 7-202138 and 2000-349251 disclose the following methods suggested to solve the problems. According to the disclosure of these documents, one terminal of a paraelectric capacitor having a paraelectric substance is connected to a floating gate electrode, and the other terminal of the paraelectric capacitor is connected to the drain of a field effect transistor or a semiconductor substrate, so that the coupling ratio (Ci/(Ci+Cf)) is increased without increasing the area of the gate electrode of the MIS field effect transistor.

However, Japanese Patent No. 2,800,745, and JP-A Nos. 7-202138 and 2000-349251 do not disclose how to write, read, and erase data to/from a memory cell independently from the other memory cells. Therefore, these disclosed methods still suffer from the disadvantages (1) to (5) in writing, reading, erasing data to/from a memory cell.

In addition, according to the methods disclosed by these documents, the paraelectric capacitor is formed separately from the MFMIS structure, and therefore additional interconnection must be provided between them. Therefore, a positioning margin therefor is necessary, which would give rise to unwanted increase in the memory cell area.

SUMMARY OF THE INVENTION

The present invention is directed to a solution to the above-described disadvantages. In order to achieve the object, the invention provides a ferroelectric non-volatile memory device, and a driving method thereof.

A ferroelectric non-volatile memory device according to the invention includes a memory cell including first and second capacitors each having one electrode connected with one electrode of the other capacitor and an MIS-FET having a gate electrode of the MIS-FET connected with the connection node of the first and second capacitors and a source region connected with the other electrode of the second capacitor, and the gate electrode is formed into a floating gate. One of the first and second capacitors is a ferroelectric capacitor, the other is a paraelectric capacitor.

By a method of driving a ferroelectric non-volatile memory device according to the invention, writing, erasure, and reading to each memory cell is carried out separately from the other memory cells using voltage having the same polarity.

According to a first aspect of the invention, a ferroelectric non-volatile memory device includes a memory cell including first and second capacitors each having one electrode connected with one electrode of the other capacitor, and an MIS-FET having a gate electrode connected with the connection node of the first and second capacitors and a source region connected with the other electrode of the second capacitor, and the gate electrode is formed into a floating gate. One of the first and second capacitors is a ferroelectric capacitor, and the other is a paraelectric capacitor. The capacitance value of the paraelectric capacitor is at least as large as the capacitance value of the ferroelectric capacitor.

According to a second aspect of the invention, a ferroelectric non-volatile memory device includes a memory cell including first and second capacitors each having one electrode connected with one electrode of the other capacitor, and an MIS-FET having a gate electrode connected with the connection node of the first and second capacitors and a source region connected with the other electrode of the second capacitor, and the gate electrode is formed into a floating gate. One of the first and second capacitors is a ferroelectric capacitor, the other is a paraelectric capacitor, the one electrode of the second capacitor is integrally formed with the gate electrode of the MIS-FET so as to overlap a part of the source region excluding the boundary between the channel region and the source region of the MIS-FET, and the other electrode of the second capacitor is made of the source region of the MIS-FET.

According to a third aspect of the invention, a ferroelectric non-volatile memory device includes a memory cell including first and second capacitors each having one electrode connected with one electrode of the other capacitor and an MIS-FET having a gate electrode connected with the connection node of the first and second capacitors and a source region connected with the other electrode of the second capacitor, and the gate electrode is formed into a floating gate. The first capacitor is a ferroelectric capacitor, the second capacitor is a paraelectric capacitor, the one electrode of the second capacitor is integrally formed with the gate electrode so as to overlap a part of the source region of the MIS-FET, and the other electrode of the second capacitor is made of the source region. The device includes an insulating layer covering the gate electrode and the one electrode of the second capacitor. The first capacitor is formed above the second capacitor, the one terminal of each of the first and second capacitors is connected with the one terminal of the other capacitor by a conductor penetrating through the insulating layer interposed between the first and second capacitors.

According to a fourth aspect of the invention, a ferroelectric non-volatile memory device includes a memory cell including first and second capacitors each having one electrode connected with one electrode of the other capacitor, an MIS-FET having a gate electrode connected with the connection node of the first and second capacitors and a source region connected with the other electrode of the second capacitor, with the gate electrode being formed into a floating gate, a source line connected to the source region of the MIS-FET, a bit line connected to the drain region of the MIS-FET and the other electrode of the first capacitor, a writing switching element provided between the bit line and the other electrode of the first capacitor, an erasure switching element provided between the source line and the other electrode of the second capacitor and between the source line and the source region, and a reading switching element provided between the bit line and the drain region of the memory cell.

According to a fifth aspect of the invention, a method of driving the ferroelectric non-volatile memory device according to the fourth aspect includes the steps of applying voltage at a positive potential to the bit line, bringing the source line to the zero potential level, turning on the erasure switching element in the memory cell to be written with data, and turning on the writing switching element in the memory cell to be written with data, thereby writing data to the memory cell.

According to a sixth aspect of the invention, a method of driving the ferroelectric non-volatile memory device according to the fourth aspect includes the steps of bringing the bit line to the zero potential voltage level, applying a positive potential to the source line, turning on the erasure switching element in the memory cell from which data is to be erased, and turning on the writing switching element in the memory cell from which data is to be erased, thereby erasing the data from the memory cell.

According to a seventh aspect of the invention, a method of driving the ferroelectric non-volatile memory device according to the fourth aspect includes the steps of applying voltage at a positive potential to the bit line, bringing the source line to the zero potential voltage level, turning on the erasure switching element in the memory cell from which data is to be read out, and turning on the reading switching element in the memory cell from which data is to be read out, thereby reading out the data from the memory cell.

According to an eighth aspect of the invention, in the ferroelectric non-volatile memory device according to the fourth aspect, the memory cells are arranged in a matrix of m rows and n columns. The device includes m word lines arranged in the row direction for driving the writing switching element, n bit lines and n source lines arranged in the column direction, m first lines arranged in the row direction for driving the reading switching elements, and m second lines arranged in the row direction for driving the erasure switching element.

According to a ninth aspect of the invention, in the ferroelectric non-volatile memory device according to any one of the second to fourth aspects, the capacitance value of the paraelectric capacitor is at least as large as the capacitance value of the ferroelectric capacitor.

According to a tenth aspect of the invention, in the ferroelectric non-volatile memory device according to any one of the first to fourth aspects, the first capacitor is a ferroelectric capacitor, the second capacitor is a paraelectric capacitor, the one electrode of the second capacitor is integrally formed with the gate electrode of the MIS-FET so as to overlap a part of the source region of the MIS-FET, the other electrode of the second capacitor is made of the source region of the MIS-FET, the one electrode of the second capacitor is partly on an element isolation region, and the first capacitor is formed on the second capacitor and in the region of the second capacitor overlapping the element isolation region.

According to an eleventh aspect of the invention, in the ferroelectric non-volatile memory device according to any one of the first to fourth aspects, the first capacitor is a ferroelectric capacitor, the second capacitor is a paraelectric capacitor, the one electrode of the second capacitor is integrally formed with the gate electrode of the MIS-FET so as to overlap a part of an element isolation region and a part of the source region, the other electrode of the second capacitor is made of the source region of the MIS-FET, and the first capacitor is formed on the second capacitor and on the source region of the MIS-FET in a region overlapping the second capacitor.

According to a twelfth aspect of the invention, in the ferroelectric non-volatile memory device according to any one of the first, third, and fourth aspects, the first capacitor is a ferroelectric capacitor, the second capacitor is a paraelectric capacitor, the one electrode of the second capacitor is formed integrally with the gate electrode of the MIS-FET by a conductor layer formed along the area from the top of the channel region of the MIS-FET to the top of the source region of the MIS-FET, the other electrode of the second capacitor is made of the source region, and the first capacitor is provided on the conductor layer and in a region overlapping the conductor layer.

In a ferroelectric non-volatile memory device according to the first aspect of the invention, first and second capacitors each having one electrode connected with one electrode of the other capacitor, and an MIS-FET has a gate as the floating gate of a memory cell connected with the connection node of the first and second capacitors, and the second capacitor is connected between the floating gate of the memory cell and the source region of the MIS-FET. One of the first and second capacitors is a ferroelectric capacitor, the other is a paraelectric capacitor. Therefore, the coupling ratio can be increased without increasing the area of the gate electrode of the MIS-FET. As a result, a sufficiently large share of voltage can be distributed to the ferroelectrics of the memory cell, and sufficiently large polarization can be provided to the ferroelectrics at the time of writing data. Furthermore, the capacitance value of the paraelectric capacitor is at least as large as the capacitance value of the ferroelectric capacitor, and voltage can effectively be applied to the ferroelectric capacitor at the time of writing and erasure. For example, assume now that the first capacitor is a ferroelectric capacitor, the second capacitor is a paraelectric capacitor, and their capacitance values are $C_f$ and $C_n$, respectively. In this state, when voltage V is applied from the other electrode of the first capacitor and writing is carried out while the source region is at the ground level (0V), voltage $V_f$ applied to the ferroelectric capacitor is represented by $V_f=V/(1+C_f/C_n)$. At the time, when $V_f$ is not less than the coercive voltage of the ferroelectrics (the coercive electric field of the ferroelectrics×the film thickness of the ferroelectrics), polarization is caused, and resultant electrostatic induction causes a positive charge at the paraelectric capacitor electrode on the ferroelectric capacitor side. When the voltage is below the writing voltage V, the positive charge is held at the paraelectric capacitor electrode on the ferroelectric capacitor side by the residual polarization of the ferroelectrics, the floating gate electrode attains a positive potential value, and an n-channel MIS-FET for example would be turned on. Note that about at least half of the voltage V applied when $C_n \geq C_f$ is applied to the ferroelectric capacitor, and therefore the capacitance value of the paraelectric capacitor is preferably equal to or larger than that of the ferroelectric capacitor. When the other electrode of the first capacitor is at the ground level (0V) and the erasure voltage V is applied from the source region, the voltage $V_f$ applied to the ferroelectric capacitor is voltage $V_f=V/(1+C_f/C_n)$ in the opposite direction, which inverts the polarization. Then, electrostatic induction generates a negative charge at the paraelectric capacitor electrode on the ferroelectric capacitor side. Then, when the voltage is below the voltage V, the negative charge is held at the paraelectric capacitor electrode on the ferroelectric capacitor side by the residual polarization of the ferroelectrics, the floating gate electrode attains a negative potential value, and an n-channel MIS-FET for example would be turned off. In this way, data can be rewritten. Note that about at least half of the voltage V applied when $C_n \geq C_f$ is applied to the ferroelectric capacitor, and therefore the capacitance value of the paraelectric capacitor is preferably equal to or larger than that of the ferroelectric capacitor.

According to the second aspect of the invention, similarly to the first aspect of the invention, the coupling ratio can be increased without increasing the area of the gate electrode of the MIS-FET. In addition, one electrode of the second capacitor is integrally formed with the floating gate so as to overlap a part of the source region excluding the boundary between the channel region and the source region, and the other electrode of the second capacitor is made of the source region. Therefore, the second capacitor is integrally formed with the MIS-FET at the connection portion with the MIS-FET, and additional interconnection is not necessary. A margin for positioning of the otherwise required interconnection is not necessary either. Therefore, unwanted increase in the area of the memory cell can be avoided. One electrode, as upper electrode, of the second capacitor does not overlap the boundary between the source region and the channel region, so that using this part and the gate electrode as a mask, the source region can be formed by self-alignment process. The boundary region between the source region and the channel region can be aligned with the end of the floating gate without any special process. More specifically, the channel length can be reduced to the minimum fabrication dimension in the LSI manufacturing process and thus good transistor characteristics can be provided.

According to the third aspect of the invention, similarly to the first aspect of the invention, the coupling ratio can be increased without increasing the area of the gate electrode of the MIS-FET. Also similarly to the second aspect of the invention, the second capacitor is integrally formed with the MIS-FET at the connection portion with the MIS-FET, and unwanted increase in the memory cell area can be avoided. Furthermore, the first capacitor is a ferroelectric capacitor, and the second capacitor is a paraelectric capacitor. There is an insulating layer covering the gate electrode and the one electrode of the second capacitor. The first capacitor is formed above the second capacitor, and one terminal of each of the first and second capacitors is connected to one terminal of the other capacitor by a conductor penetrating through the insulating layer interposed between the first and second capacitors. Therefore, the MIS-FET once completed has already been covered with the insulating layer and thus protected at the time of formation of the ferroelectric capacitor, and the MIS-FET is kept from being contaminated with residue after processing the ferroelectric capacitor or a material in the ferroelectrics diffused by heat treatment, so that good transistor characteristics can be provided.

In the ferroelectric non-volatile memory device according to the fourth aspect of the invention, the writing switching element, the erasure switching element, the reading operation switching element are used in combination at the time of writing, erasure, and reading to/from a memory cell. In this way, data can be written, erased, and read out to/from a memory cell whose word line, bit line and source line are selected separately from the other memory cells, and voltage to be applied for these operations can have the same polarity.

According to a method of driving the ferroelectric non-volatile memory device according to the fifth aspect of the invention, voltage at a positive potential is applied to the bit line, the source line is brought to the zero potential level, and the erasure switching element in the memory cell to be written with data is turned on. The zero potential on the source line is then applied to the other electrode of the second capacitor, the paraelectric capacitor for example in a memory cell to be written with data and the source region of the memory cell in order to turn on the writing switching element in the memory cell, so that the positive potential of the bit line is applied to the upper electrode of the memory cell to be written with data. The paraelectric capacitor provides a large coupling ratio, and therefore a share of the voltage greater than the coercive voltage is distributed to the ferroelectrics of the memory cell to be written with data, which generates residual polarization. The charge in response to this is induced at the semiconductor substrate of the detection MIS-FET, and the MIS-FET is turned on, so that data is written to the memory cell. According to the method of writing data to the memory cell by the ferroelectric non-volatile memory device as described above, in memory cells other than the memory cell to be written with data, the erasure switching element and the writing switching element are both in an off state, and therefore the writing voltage is never applied to the memory cells through the bit line. Consequently, the other memory cells are not affected by the data writing operation.

According to a method of driving the ferroelectric non-volatile memory device according to the sixth aspect of the invention, the bit line is brought to the zero potential voltage level, a positive potential is applied to the source line, the erasure switching element in the memory cell from which data is to be erased is turned on, and then the positive potential voltage on the source line is applied to the other electrode of the second capacitor and the source region of the memory cell from which data is to be erased. When the writing switching element in the memory cell whose data is to be erased is turned on accordingly, the zero potential on the bit line is applied to the upper electrode of the memory cell whose data is to be erased. Then, the distribution voltage in the direction opposite to that of the data writing operation is applied to the ferroelectrics, which inverts the polarization of the ferroelectrics, so that the data is rewritten. Then, the MIS-FET is turned off and the data is erased. According to the method of erasing data from the memory cell using the ferroelectric non-volatile memory device according to the invention, the erasure switching element and the writing switching element are in an off state in the memory cells other than the memory cell whose data is to be erased, and therefore the erasure voltage is never applied to the memory cells through the source line. As a result, data in the other memory cells is not destroyed.

According to a method of driving the ferroelectric non-volatile memory device according to the seventh aspect of the invention, voltage at a positive potential is applied to the bit line, the source line is brought to the zero potential level, the erasure switching element in the memory cell from which data is to be read out is turned on, so that the zero potential on the source line is applied to the source region of the memory cell whose data is to be readout. When the reading switching element in the memory cell whose data is to be read out is turned on accordingly, the positive potential on the bit line is applied to the drain region of the memory cell whose data is to be read out. Then, since the conductivity of the channel region is different based on whether or not the ferroelectrics has polarization by the written data, current passed from the bit line to the source line is different accordingly. The current may be detected in order to detect the data. According to the method of reading data from a memory cell described above in the ferroelectric non-volatile memory device according to the invention, in the memory cells other than the one whose data is to be read out, the erasure switching element and the reading switching element are in an off state, and therefore current never comes onto the source line from the other memory cells. Consequently, the data can surely and stably be read out.

According to the eighth aspect of the invention, in the ferroelectric non-volatile memory device according to the fourth aspect of the invention, the memory cells are arranged in a typical matrix of m rows and n columns. In the device, m word lines arranged in the row direction each drive the writing switching element that connects the upper electrode of each of the memory cells to the bit line in the row, m first lines arranged in the row direction each drive a reading switching element that connects the drain region of each of the memory cells in the row to the bit line, and m second lines arranged in the row direction each drive an erasure switching element that connects the source region of each of the memory cells in the row and the paraelectric capacitor to the source line. In this way, writing, erasure, and reading voltages can be applied only to a selected memory cell at the time of writing, erasure, and reading operations and the other non-memory cells can be separated from the voltages.

According to the ninth aspect of the invention, in the ferroelectric non-volatile memory device according to any one of the second to fourth aspects of the invention, similarly to the first aspect of the invention, the capacitance value of the second capacitor is at least as large as the capacitance value of the first capacitor and therefore voltage can more efficiently be applied to the paraelectric capacitor at the time of writing and erasure.

According to the tenth aspect of the invention, in the ferroelectric non-volatile memory device according to any one of the first to fourth aspects of the invention, the second capacitor of the paraelectric capacitor integrally formed with the floating gate is placed on the element isolation region, and the first capacitor of the ferroelectric capacitor is placed on a region over lapping the element isolation region. Therefore, the channel length can be set regardless of the size of the first capacitor. The channel length can be reduced as much as possible in order to achieve high speed operation of the transistor. In addition, a margin for aligning a layered structure such as the ferroelectrics forming the first capacitor and the upper electrode can be secured.

According to the eleventh aspect of the invention, in the ferroelectric non-volatile memory device according to any one of the first to fourth aspects of the invention, the second capacitor of the paraelectric capacitor formed integrally with the floating gate is placed on the element isolation region and the source region, while the first capacitor of the ferroelectric capacitor is placed above the second capacitor and on the source region in the region overlapping the second capacitor. In this way, the area of the ferroelectric capacitor relative to the paraelectric capacitor can be reduced, so that the coupling ratio can be increased.

According to the twelfth aspect of the invention, in the ferroelectric non-volatile memory device according to any one of the first, third and fourth aspects of the invention, the second capacitor of the paraelectric capacitor is formed integrally with the floating gate by a conductor layer formed along the area from the top of the channel region of the MIS-FET to the top of the source region, while the first capacitor of ferroelectric capacitor is formed above the conductor layer and in a region overlapping the conductive layer. In this way, the area of the ferroelectric capacitor relative to the paraelectric capacitor can be reduced, so that the coupling ratio can be increased.

In the ferroelectric non-volatile memory device according to the tenth to twelfth aspects of the invention, the floating gate and the ferroelectric capacitor are manufactured separately, and therefore residue of the ferroelectrics for example does not adversely affect the MIS-FET that is produced in the preceding process, so that good transistor characteristics can be provided. The first and second capacitors are formed one on the other in the vertical direction, and therefore interconnection in the horizontal direction of the semiconductor substrate is not necessary. This allows the occupied area to be reduced as much as possible, one electrode of each of the capacitors can be directly placed on one electrode of the other capacitor or may be formed integrally if necessary, so that the interconnection process is entirely done away with and the manufacturing process may be simplified as much as possible.

BRIEF DESCRIPTION OF THE DRAWINGS

FIG. 5 is a table showing voltages applied to lines shown in FIG. 4 at the time of data writing, erasure, and reading to/from a single memory cell C11 in FIG. 4;

DETAILED DESCRIPTION OF THE PREFERRED EMBODIMENTS

Figure 1:
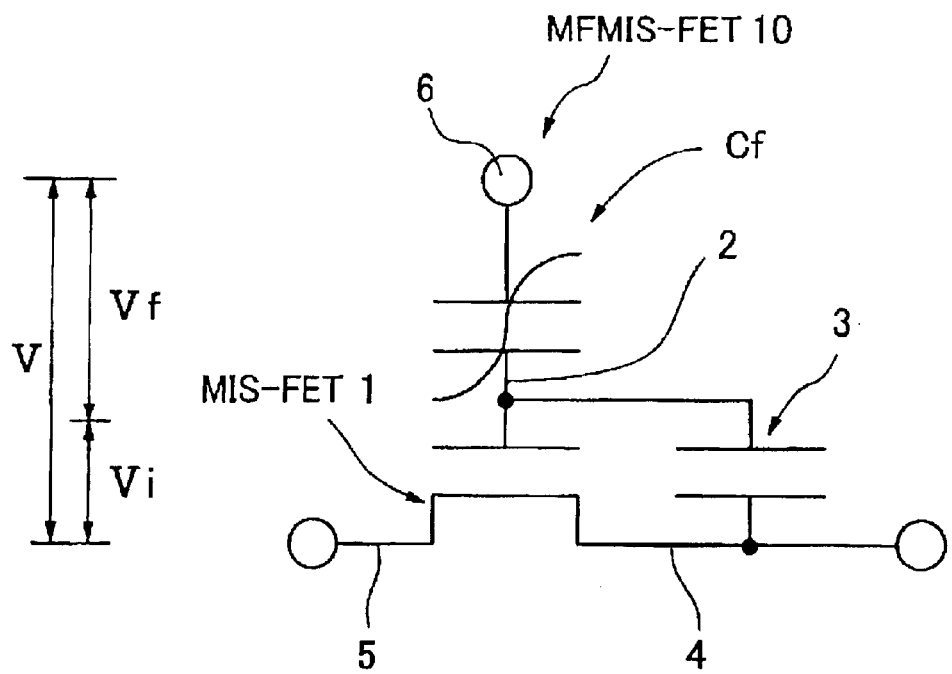
FIG. 1 is an equivalent circuit diagram of a ferroelectric non-volatile memory transistor according to the invention.

Now, the best mode to carry out the invention will be described in conjunction with the accompanying drawings.
Embodiments of the Invention FIG. 1 is an equivalent circuit diagram of a ferroelectric, non-volatile memory transistor according to the invention. In an MFMIS (Metal Ferroelectric Metal Insulator Semiconductor)-FET (Field Effect Transistor) 10, a floating gate electrode 2 is provided between a ferroelectric capacitor Cf as a first capacitor of a thin film of ferroelectrics such as SBT ($SrBi_2Ta_2O_9$) and a gate insulator. The floating gate electrode 2 is connected with one terminal of a paraelectric capacitor 3 as a second capacitor, and the terminal of the paraelectric capacitor 3 on the opposite side to the terminal connected to the floating gate electrode 2 is connected to the source 4 of the MIS (Metal Insulator Semiconductor) field effect transistor 1 (hereinafter simply as "MIS-FET"). More specifically, the memory cell includes the first and second capacitors each having one electrode connected with one electrode of the other capacitor, and the MIS-FET. In the MIS-FET, the connection node of the first and second capacitors is connected with the gate electrode of the MIS-FET and the gate electrode is formed into a floating gate. The other electrode of the second capacitor is connected with the source region.

As shown in FIG. 1, the floating gate electrode 2 is connected with the paraelectric capacitor 3, so that the area between the upper electrode 6 of the ferroelectric capacitor Cf and the terminal of the paraelectric capacitor 3 that is not connected to the floating gate 2 can be provided with voltage. In particular, the capacitance value of the paraelectric capacitor 3 is not less than the capacitance value of the ferroelectric capacitor Cf. In this way, voltage can efficiently be applied by the paraelectric capacitor at the time of writing and erasure. When for example the capacitance values of the ferroelectric capacitor and the paraelectric capacitor are Cf and Cn, respectively, writing voltage V is applied from the upper electrode 6 of the ferroelectric capacitor Cf, and writing is carried out as the source 4 is at the ground level (0V), the voltage Vf to be applied to the ferroelectric capacitor Cf is $Vf=V/(1+Cf/Cn)$. At the time, when Vf is not less than the coercive voltage of the ferroelectrics (the coercive electric field of the ferroelectrics×the film thickness of the ferroelectrics), polarization is caused, and resultant electrostatic induction generates a positive charge at the paraelectric capacitor electrode on the ferroelectric capacitor side. When the voltage is below the writing voltage V, the positive charge is held at the paraelectric capacitor electrode on the ferroelectric capacitor side by the residual polarization of the ferroelectrics, the floating gate attains a positive potential, and an n-channel MIS-FET for example would be turned on. When the erasure voltage V is applied from the source 4 as the upper electrode 6 of the ferroelectric capacitor Cf is at the ground level (0V), voltage Vf to be applied to the ferroelectric capacitor is $Vf=V/(1+Cf/Cn)$ in the opposite direction, which inverts the polarization and resultant static induction causes a negative charge at the paraelectric capacitor electrode on the ferroelectric capacitor side. When the voltage V is cut off, the negative charge is held at the paraelectric capacitor electrode on the ferroelectric capacitor side, the floating gate attains a negative potential, and an n-channel MIS-FET for example would be turned off. In this way, data can be rewritten. Note that according to the embodiment, the semiconductor substrate attains a floating state at the time of writing and erasure.

In addition, as will be described, the upper electrode of the paraelectric capacitor 3 is integrally formed with the floating gate electrode 2 so as to overlap a part of the source region excluding the boundary between the source region and the channel region. The lower electrode of the paraelectric capacitor 3 is made of the source region. The paraelectric capacitor 3 is therefore integrally formed with the data detection MIS-FET 1 at the connection portion with the MIS-FET 1, so that additional interconnection is not necessary and a margin for positioning of such otherwise necessary interconnection is not necessary either. Therefore, unwanted increase in the area of the memory cell can be avoided. The upper electrode does not overlap the boundary between the source region and the channel region, so that using the upper electrode and the floating gate electrode 2 as a mask, the source region can be formed by self-alignment. The boundary between the source region and the channel region can be aligned with the end of the floating gate electrode 2 without any special process. More specifically, the channel length can be reduced to the minimum fabrication dimension in the LSI manufacturing process.

Figure 2:
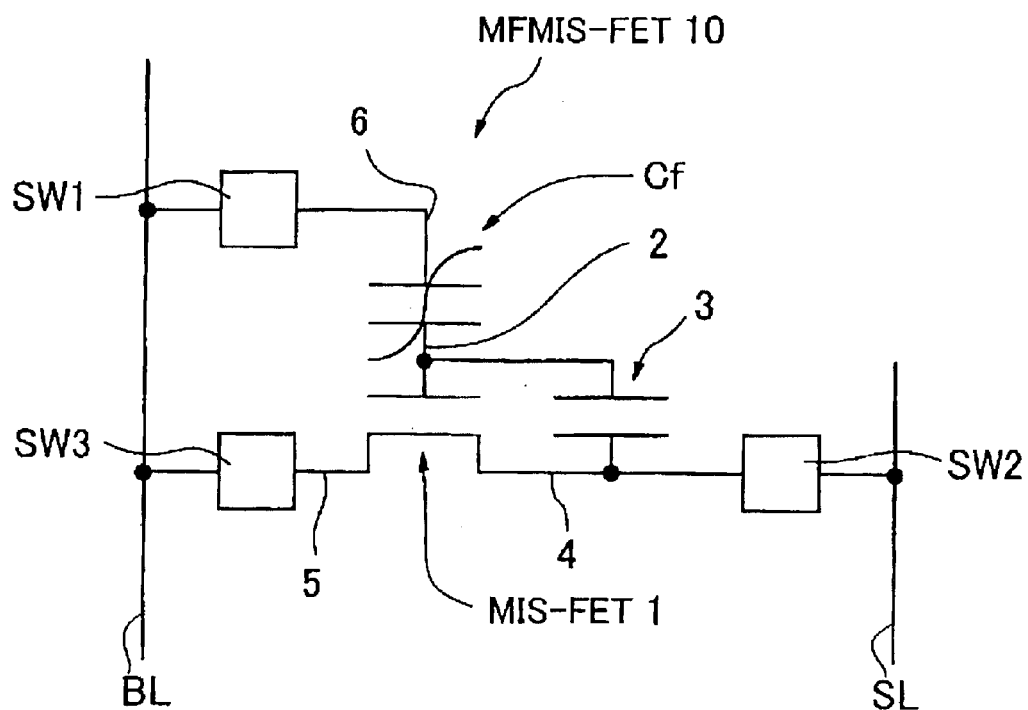
FIG. 2 is a schematic diagram of a ferroelectric non-volatile memory cell according to the invention.

FIG. 2 is a schematic diagram of the ferroelectric non-volatile memory transistor 10 according to the invention in the equivalent circuit diagram in FIG. 1 applied as a memory cell 20. In the memory cell 20 shown in FIG. 2, a writing switching element SW1 is provided between the upper electrode 6 of the ferroelectric capacitor Cf, in the structure of the MFMIS-FET 10, and the bit line BL, so that voltage on the bit line BL is selectively applied to the upper electrode 6. An erasure switching element SW2 is provided between the source line SL and the terminal of the paraelectric capacitor 3 on the opposite side of the floating gate electrode 2. Voltage on the source line SL can selectively be applied to the source region 4 of the MIS-FET 1 and the terminal of the paraelectric capacitor 3 on the opposite side to the floating electrode 2. A reading switching element SW3 is provided between the bit line BL and the drain region 5 of the MIS-FET 1, and voltage on the bit line BL can selectively be applied to the drain region 5 of the MIS-FET.

The switching elements SW1, SW2, and SW3 for writing, erasure, and reading are provided in the ferroelectric non-volatile memory cell 20 in the above described manner in FIG. 2. In this way, unwanted voltage is never applied to the ferroelectric capacitor Cf of non-selected memory cells 20 at the time of writing, erasure, and reading. Consequently, the polarization of the ferroelectrics is kept from being degraded or inverted. Therefore, data is not destroyed. At the time of reading, non-selected memory cells 20 are not connected to the bit line BL and the source line SL, so that current to the non-selected memory cells 20 which could otherwise cause erroneous reading is not generated at the bit line BL and the source line SL.

Figure 3:
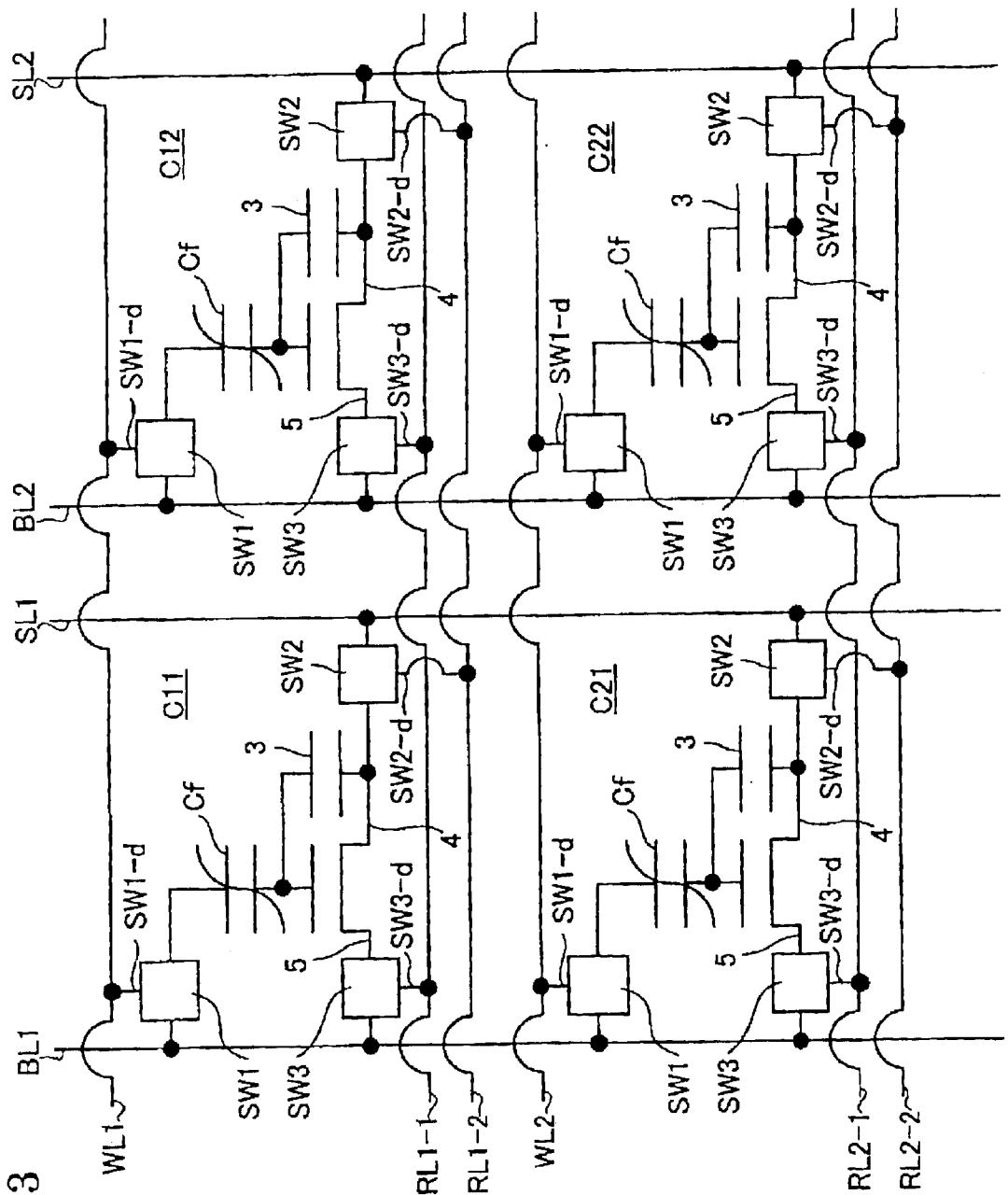
FIG. 3 is a schematic diagram of ferroelectric non-volatile memory cells arranged in a matrix according to the invention.

FIG. 3 is a diagram of the configuration of a ferroelectric non-volatile memory device including four memory cells C11, C12, C21, and C22 each identical to the memory cell 20 shown in FIG. 2 and arranged in a matrix of two rows and two columns. The matrix includes m rows and n columns in reality (m, n: an integer not less than 2). In the circuit configuration according to the invention shown in FIG. 3, m word lines WL1, WL2, . . . , and WLm (not shown) extending in the horizontal direction in the figure (hereinafter as "the row direction") are each connected to a driving terminal SW1-$d$ in the writing switching element SW1 in all the memory cells in the rows C11, C12, C1n (not shown), C21, C22, . . . , C2n (not shown), . . . , Cm1 (not shown) . . . , and Cmn (not shown). In the same manner, m first lines RL1-1, RL2-1, . . . , and RLm-1 (not shown) extending in the row direction are each connected to a driving terminal SW3-$d$ in the reading switching element SW3 in all the memory cells in the rows C11 C12, . . . , C1n (not shown), C21, C22, . . . , C2n (not shown), . . . , Cm1 (not shown), . . . , and Cmn (not shown). In the same manner, m second lines RL1-2, RL2-2, . . . , and RLm-2 (not shown) extending in the row direction are each connected with a driving terminal SW2-$d$ in the erasure switching element SW2 in all the memory cells C11, C12, . . . , C1n (not shown), C21, C22, . . . , C2n (not shown), . . . , Cm1 (not shown), . . . , and Cmn (not shown) in the rows.

Also, n bit lines BL1, BL2, . . . , and BLn (not shown) extending in the vertical direction in the figure (hereinafter as "the column direction") are each connected to the upper electrode of the ferroelectric capacitor Cf through the writing switching element SW1 and to the drain region 5 through the reading switching element SW3 in all the memory cells C11, C21, . . . , Cm1 (not shown), C12, C22, . . . , Cm2 (not shown), . . . , C1n (not shown), . . . , and Cmn(not shown) in the columns. In the same manner, n source lines SL1, SL2, . . . , and SLn (not shown) extending in the column direction are connected to the source region 4 and the terminal of the paraelectric capacitor 3 on the opposite side to the gate electrode 2 through the erasure switching element SW2 in all the memory cells C11, C21, . . . , Cm1 (not shown), C12, C22, . . . , Cm2 (not shown), . . . , C1n (not shown), . . . , and Cmn (not shown) in the columns.

The word lines WL1, WL2, . . . , and WLm (not shown), the first lines RL1-1, RL2-1, . . . , and RLm-1 (not shown), the second lines RL1-2, RL2-2, . . . , and RLm-2 (not shown), the bit lines BL1, BL2, . . . , and BLn (not shown) and the source lines SL1, SL2, . . . , and SLn (not shown) are selected by a selection circuit that is not shown.

Figure 4:
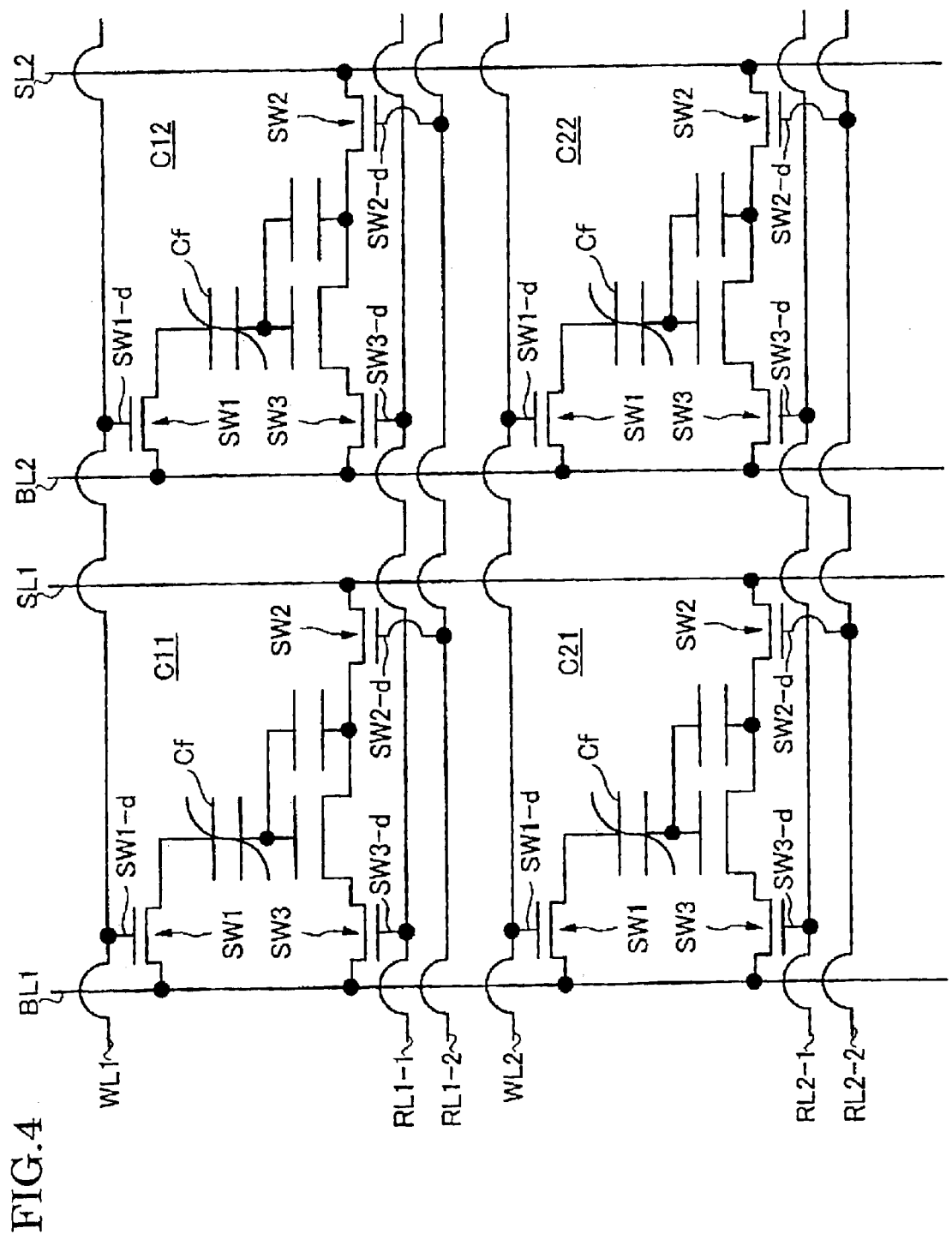
FIG. 4 is a circuit diagram of a ferroelectric non-volatile memory device having ferroelectric memory cells arranged in a matrix according to the invention.

In FIG. 4, the switching elements SW1, SW2, and SW3 for writing, erasure, and reading in the memory cells C11, C12, . . . , and C1$m$ (not shown), C21, C22, . . . , C2$m$ (not shown), . . . , Cn1 (not shown), . . . , Cnm (not shown) in FIG. 3 are each a field effect transistor (hereinafter as "FET"). Their control gates are the driving terminals SW1-$d$, SW2-$d$, and SW-3, respectively. The driving terminals SW1-$d$, SW2-$d$, and SW-3 are connected to the word lines WL1, WL2, . . . , and WLm (not shown), the second lines RL1-2, RL2-2, . . . , and RLm-2 (not shown) and the first lines RL1-1, RL2-1, . . . , and RLm-1 (not shown), respectively.

FIG. 5 is a table showing voltages applied to the word lines WL1 and WL2, the bit lines BL1 and BL2, the source lines SL1 and SL2, the first lines RL1-1 and RL2-1, and the second lines RL1-2 and RL2-2 when data writing, erasure and reading operations are carried out to the single memory cell C11 in FIG. 4.

Referring to the table in FIG. 5, a method of writing data to the memory cell C11 in FIG. 4 will be described. The writing switching element SW1, the erasure switching element SW2, the reading switching element SW3 and the detection MIS-FET 1 are each an FET formed on a p-type semiconductor substrate. As given in the column for "writing" in FIG. 5, the source line SL1 is provided with 0V, and the bit line BL1 is provided with a positive program voltage Vp. The positive program voltage Vp is applied to the first line RL1-2 in order to turn on the FET as the erasure switching element SW2. The word line WL1 is then provided with the positive program voltage Vp in order to turn on the FET as the writing switching element SW1. All the other lines RL1-1, BL2, SL2, WL2, RL2-1, RL2-2 are at 0V. At the time, the capacitance values of the ferroelectric capacitor and the paraelectric capacitor are Cf and Cn, respectively. The voltage Vf applied to the ferroelectric capacitor Cf of the memory cell C11 is represented by Vf=Vp/(1+Cf/Cn). Therefore, polarization is caused at the ferroelectric thin film of the ferroelectric capacitor Cf, so that data can be written. The data is represented by the polarization, so that charge induced by the polarization of the ferroelectric capacitor Cf causes electrons to be induced to the semiconductor side of the channel region of the detection MIS-FET 1 through the floating gate electrode by electrostatic induction. This turns on the memory cell C11.

At the time of writing data to the memory cell C11, the program voltage Vp is applied to the driving terminals SW1-$d$ and SW2-$d$ of the writing switching element SW1 and the erasure switching element SW2, respectively in the other memory cell C12 in the same row and these terminals attain an on state. However, the bit line BL2 and the source line SL2 connected to the other memory cell C12 in the row are both at the level of 0V, and therefore the voltage is not applied to the ferroelectric capacitor Cf of the other memory cell C12 in the row.

At the time of writing data to the memory cell C11, for the memory cell C21 in the same column connected to the same bit line BL1 and the source line SL1, the voltage on the word line WL2 is 0V and therefore the FET as the writing switching element SW1 in the memory cell is in an off state. The program voltage Vp between the bit line BL1 and the source line SL1 is therefore not applied to the ferroelectric capacitor Cf of the memory cell C21.

At the time of writing data to the memory cell C11, for the memory cell C22 in the other row and column not connected to the same bit line BL1 and the source line SL1, the writing switching element SW1 and the erasure switching element SW2 are in an off state, and therefore the voltage on the bit line BL2 and the source line SL2 connected to the memory cell C22 are both at 0V. Therefore, no voltage is applied to the ferroelectric capacitor Cf of the memory cell C22. Consequently, the writing operation only to the selected memory cell C11 can be carried out and then on-selected memory cells are not affected by the writing voltage.

Now, a method of erasing data from the memory cell C11 in FIG. 4 will be described. As shown in the "erasure" column in the table in FIG. 5, the source line SL1 is provided with positive program voltage Vp, and the bit line BL1 is provided with 0V. Then, the positive program voltage Vp is applied to the second line RL1-2 in order to turn on the FET as the erasure switching element SW2. Then, the positive program voltage Vp is applied to the word line WL1, and the FET as the writing switching element SW1 is turned on. The other lines are all at 0V as shown in the "erasure" column.

At the time of the erasure operation, the voltage Vf applied to the ferroelectric capacitor Cf of the memory cell C11 is voltage $Vf=Vp/(1+Cf/Cn)$ in the opposite direction to that of the writing operation. Therefore, the polarization of the ferroelectrics of the ferroelectric capacitor Cf is inverted, and charge induced in response to the inverted polarization of the ferroelectrics causes holes to be induced to the semiconductor region of the channel region of the detection MIS-FET 1, so that the memory cell C11 is turned off.

When data is erased from the memory cell C11, the writing switching element SW1 and the erasure switching element SW2 in the other memory cell C12 in the same row are both turned on. However, the bit line BL2 and the source line SL2 connected to the memory cell C12 are both at 0V, and therefore no voltage is applied to the ferroelectric capacitor Cf of the memory cell C12.

For the memory cell C21 in the same column that is connected to the same bit line BL1 and the source line SL1 as the memory cell C11 whose data is to be erased, the word line WL2 is at 0V, the writing switching element SW1 is in an off state, the second line RL2-2 is at 0V and the erasure switching element SW2 is in an off state. Therefore, the positive voltage Vp from the source line SL1 is not applied to the ferroelectric capacitor Cf of the memory cell C21.

For the memory cell C22 in the other row and column, the word line WL2 is at 0V, the voltage on the second line RL2-2 is 0V, and therefore the writing switching element SW1 and the erasure switching element SW2 are both in an off state. In addition, the bit line BL2 and the source line SL2 connected to these elements are at 0V, and therefore no voltage is applied to the ferroelectric capacitor Cf.

Consequently, the erasure operation only to the selected memory cell C11 can be carried out, and the non-selected memory cells are not affected by the erasure voltage.

Now, a method of reading out data from the memory cell C11 in FIG. 4 will be described. As shown in the "reading" column in the table in FIG. 5, a voltage of 0V is applied to the source line SL1, and a positive reading voltage Vd is applied to the bit line BL1. A positive voltage Vp is applied to the first and second lines RL1-1 and RL1-2 in order to turn on both the FETs as the erasure switching element SW2 and the reading switching element SW3. The other lines are all at 0V as shown in FIG. 5.

At the time of reading out data from the memory cell C11, the threshold voltage for the detection MIS-FET changes depending on the polarization state of the ferroelectrics of the ferroelectric capacitor Cf corresponding to the data written in the memory cell C11. This change alters the magnitude of current passed across the area between the bit line BL1 and the source lines SL1 through the channel region of the MIS-FET. The change in the current can be used to read the data in the memory cell C11.

At the time, for the memory cell C21 in the same column that is connected to the same bit line BL1 and the source line SL1, the word line WL2 is at 0V, the writing switching element SW1 is in an off state, the reading voltage Vd applied to the bit line BL1 is not applied to the ferroelectric capacitor Cf of the memory cell 21, and the data stored therein is not destroyed. Since the first line RL2-1 and the second line RL2-2 are both at 0V and therefore in an off state, the erasure switching element SW2 and the reading switching element SW3 in the memory cell C21 are both in an off state. These lines are separated from the bit line BL1 and the source line SL1 and therefore data in the memory cell C21 is not erroneously read onto the same bit line BL1 and the same source line SL1.

Therefore, only the data stored in the selected memory cell C11 can be read out. At the time, the non-selected memory cell C21 is not affected by the reading voltage, and current that could otherwise cause erroneous reading is not passed to the bit line BL1 and the source line SL1.

At the time of reading out data from the memory cell C11, the erasure switching element SW2 and the reading switching element SW3 in the other memory cell C12 in the same row are in an on state, but the bit line BL2 and the source line SL2 connected to the other memory cell C12 in the same row are both at 0V, and therefore no voltage is applied to the ferroelectric capacitor Cf of the memory cell C12.

At the time of reading out the memory cell C11, the writing switching element SW1, the erasure switching element SW2 and the reading switching element SW3 in the memory cell C22 in the other row and column are all in an off state, and the bit line BL2 and the source line SL2 are both at 0V. Therefore, no voltage is applied to the ferroelectric capacitor Cf of the memory cell C22.

In this way, when data is read out from the memory cell C11, unwanted voltage that could otherwise rewrite data in non-selected memory cells or degrade the polarization state of the ferroelectrics of the non-selected emery cells is not applied.

According to the embodiment described above, the above-described configuration allows data to be separately written, erased, and read out to/from an arbitrary memory cell without affecting and/or separately from non-selected memory cells, and voltage to be applied can have the same polarity.

Figure 6A:
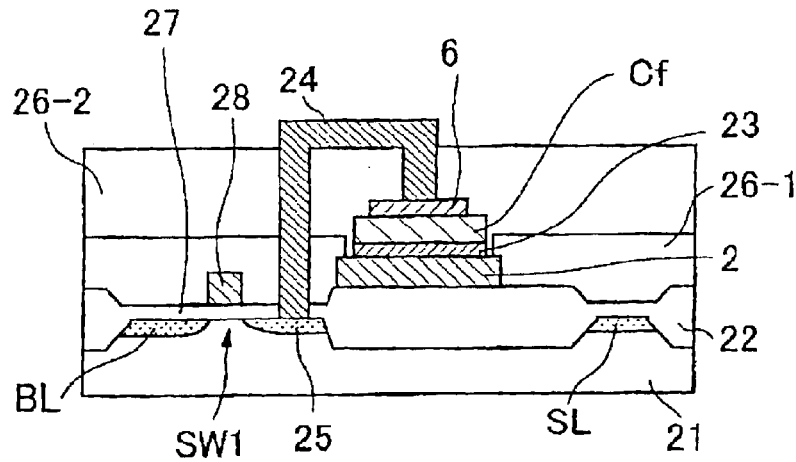
FIGS. 6A to 6C show the memory cell in the schematic representation in FIG. 2 according to an embodiment of the invention, FIGS. 6A and 6C being sectional views and FIG. 6B being a plan view.
Figure 6B:
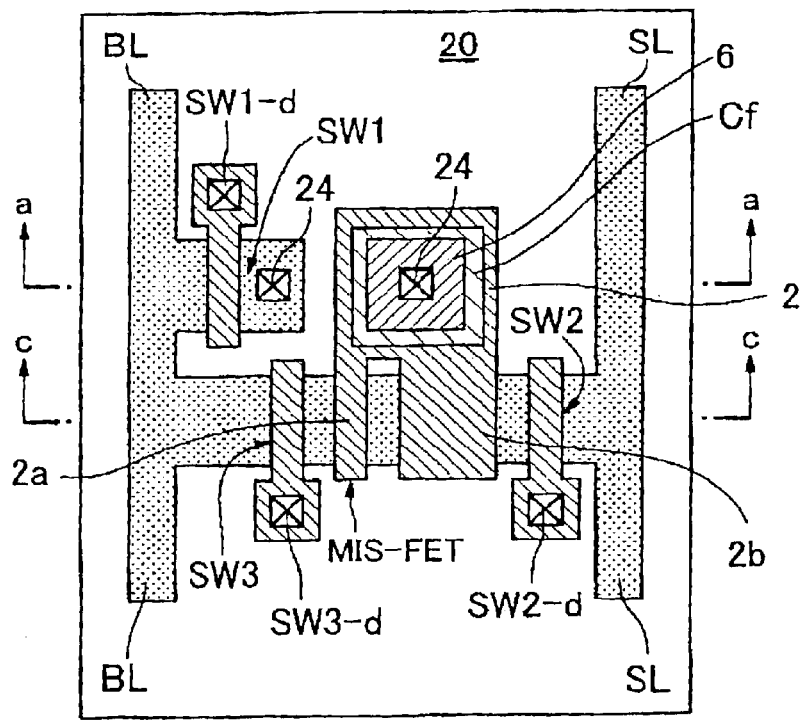
Figure 6C:
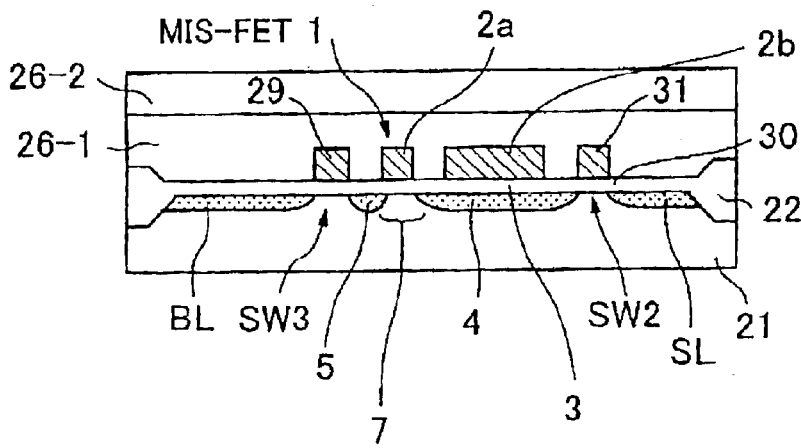

Now, referring to FIGS. 6A to 6C, the ferroelectric non-volatile memory cell 20 according to the invention described above in conjunction with the schematic diagram in FIG. 2 will be more specifically described by referring to specific details related to the configuration. In FIGS. 6A to 6C, the same elements as those of the memory cell 20 in FIG. 2 are denoted by the same reference characters. FIG. 6A is a sectional view taken along line a—a in the plan view in FIG. 6B. FIG. 6C is a sectional view taken along line c—c in FIG. 6B.

Referring to FIGS. 6A and 6B, an element isolation region of a thick oxide film 22 formed integrally with a thin oxide film is provided on a p-type semiconductor substrate 21. A polycrystalline silicon layer to form the floating gate electrode 2 of the data detection MIS-FET 1 is placed on the thick element isolation region 22. In order to prevent contamination with the ferroelectrics, an oxide film as an interlayer insulating film 26-1 is formed on these layers. The interlayer insulating film on the polycrystalline silicon is provided with a hole, through which the polycrystalline silicon is exposed. A conductor ($IrO_2$) layer 23 to prevent mutual diffusion between the ferroelectrics such as SBT ($SrBi_2Ta_2O_9$) and the polycrystalline silicon is formed on the floating gate electrode 2 of the polycrystalline silicon layer. A thin layer of the ferroelectrics SBT ($SrBi_2Ta_2O_9$) to form the ferroelectric capacitor Cf is formed thereon. A layer of platinum (Pt) forming the upper electrode 6 of the ferroelectric capacitor Cf is formed on the ferroelectric thin layer. The upper electrode 6 is electrically connected with an n-type diffusion layer 25, which is formed in the semiconductor substrate 21, through insulating films 26-1,2 covering the memory cell 20 via a conductive material 24. The n-type diffusion layer 25 forms the FET as the writing switching element SW1 used to selectively connect the upper electrode 6 to the bit line BL in the n-diffusion layer formed also in the semiconductor substrate 21 together with the polycrystalline silicon forming the gate electrode 28 placed on the semiconductor substrate 21 with a gate insulating film 27 interposed therebetween. The driving terminal SW1-$d$ formed at the gate electrode 28 of the writing switching element SW1 is connected with a word line that is not shown.

Now, referring to FIGS. 6B and 6C, the bit line BL of then-type diffusion layer formed in the semiconductor substrate 21 is selectively connected to a drain region 5 of the n-type diffusion layer formed in the semiconductor substrate 21 for the detection MIS-FET 1 through the FET as the reading switching element SW3. The drain of the FET as the reading switching element SW3 is integrally formed with the n-type diffusion layer of the bit line BL, and the source region is integrally formed with the drain region 5 of the detection MIS-FET 1. The driving terminal SW3-$d$ formed at the gate electrode 29 of the reading switching element SW3 is connected with a first line that is not shown.

The floating gate electrode 2 of the detection MIS-FET 1 is placed on the semiconductor substrate 21 with a gate insulating film therebetween. The floating gate electrode 2 has two arms 2$a$ and 2$b$, and the arm 2$a$ is placed on the channel region in the semiconductor substrate 21 of the detection MIS-FET 1 with a gate insulating film interposed therebetween and forms the gate electrode 2$a$ of the MIS-FET 1. The other arm 2$b$ is placed on an n-type diffusion layer 4 formed in the semiconductor substrate 21 with the same gate insulating film therebetween, and thus forms one end of the paraelectric capacitor 3. The n-type diffusion layer 4 also serves as the source region of the detection MIS-FET 1. The central part of the floating gate electrode 2 is placed on the thick oxide film 22 for element isolation as described above and forms the ferroelectric capacitor Cf together with the ferroelectric thin film. The source region 4 is selectively connected to the source line SL in the n-type diffusion layer formed in the semiconductor substrate 21 by the FET as the erasure switching element SW2 having the gate electrode 31 of the polycrystalline silicon placed on the semiconductor substrate 21 with a gate insulating film 30 interposed therebetween. The gate electrode 31 of the erasure switching element SW2 is provided with the driving terminal SW2-$d$, which is connected to a second line that is not shown.

According to the embodiment shown in FIGS. 6A to 6C, the upper electrode of the paraelectric capacitor 3 is made of the arm 2$b$ formed integrally with the floating gate electrode 2 so as to overlap a part of the source region 4 excluding the boundary between the source region 4 and the channel region 7. The lower electrode of the paraelectric capacitor 3 is made of the source region 4. In other words, the paraelectric capacitor 3 is integrally formed with the MIS-FET 1 at the connection portion with the data detection MIS-FET 1. Therefore, additional interconnection is not necessary, and thus a margin for positioning the additional interconnection is not necessary either. In this way, unwanted increase in the area of the memory cell can be avoided. The upper electrode does not overlap the boundary between the source region 4 and the channel region 7, so that using the upper electrode and the floating gate electrode 2 as a mask, the source region 4 can be formed in a self-alignment process with no special process required. In this way, the boundary between the source region 4 and the channel region 7 can be aligned with the end of the floating gate electrode 2. Note that the overlapping part between the arm 2$b$ and the source region 4 need only be provided with an n-type diffusion layer before forming the floating gate electrode 2. Alignment with the source region 4 to be formed later is easier than the alignment with the gate. The ferroelectric capacitor Cf is formed on the thick oxide film 22 of the element isolation region apart from the channel region of the data detection MIS-FET 1. Therefore, registration of the layers placed upon each other is advantageously easy. The oxide film is present as the interlayer insulating film between the ferroelectrics and the MIS-FET 1, the ferroelectric capacitor 3 and the switching elements (SW1, SW2, SW3), so that contamination with the ferroelectrics can be prevented.

Figure 7A:
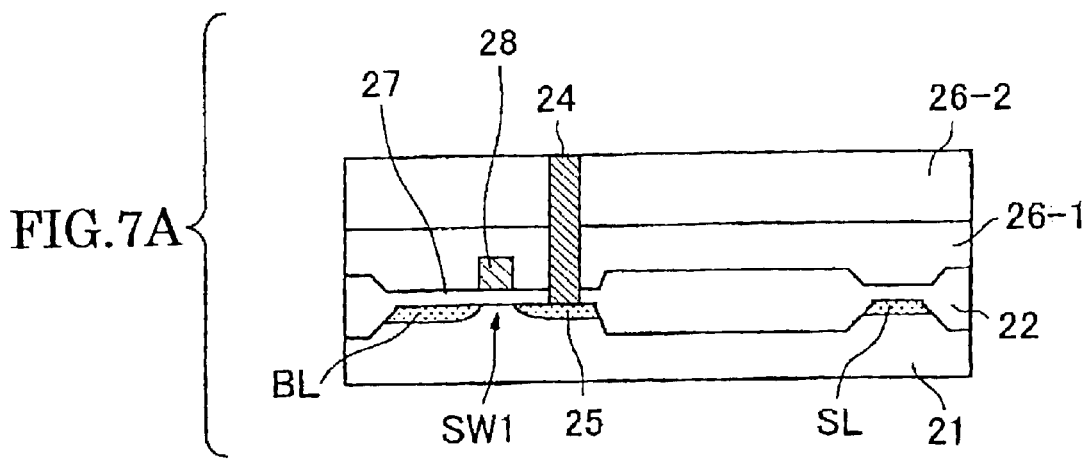
FIGS. 7A to 7C show the memory cell in the schematic representation in FIG. 2 according to another embodiment of the invention, FIGS. 7A and 7C being sectional views and FIG. 7B being a plan view.
Figure 7B:
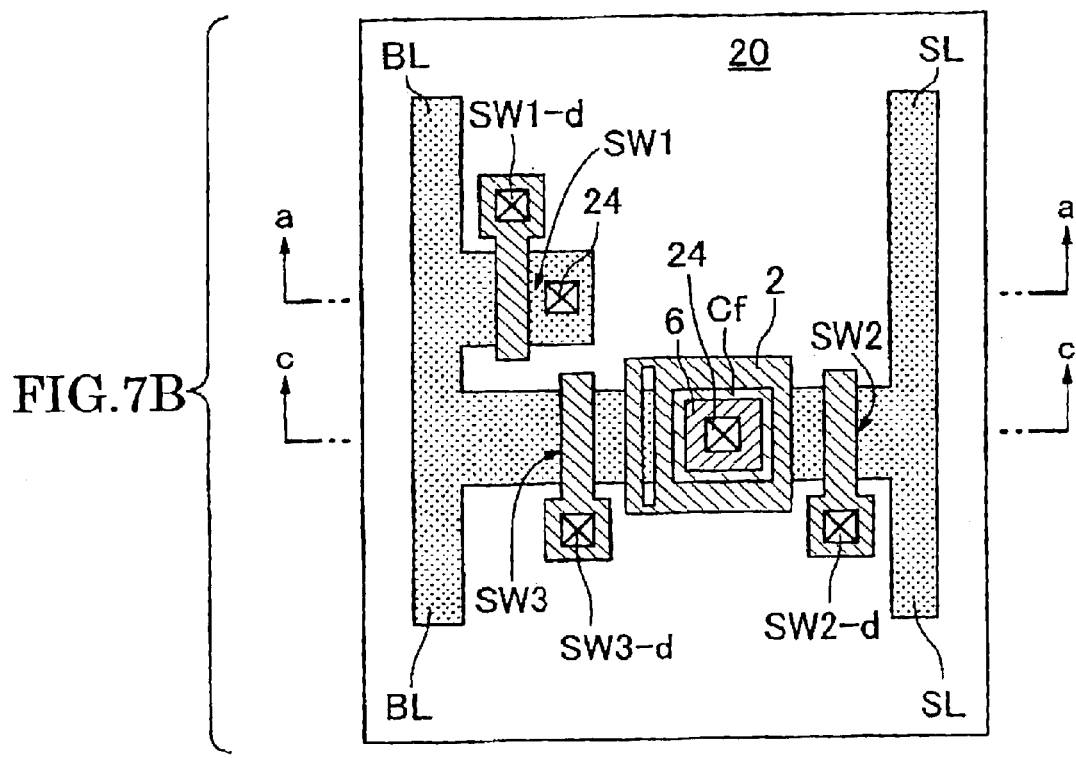
Figure 7C:
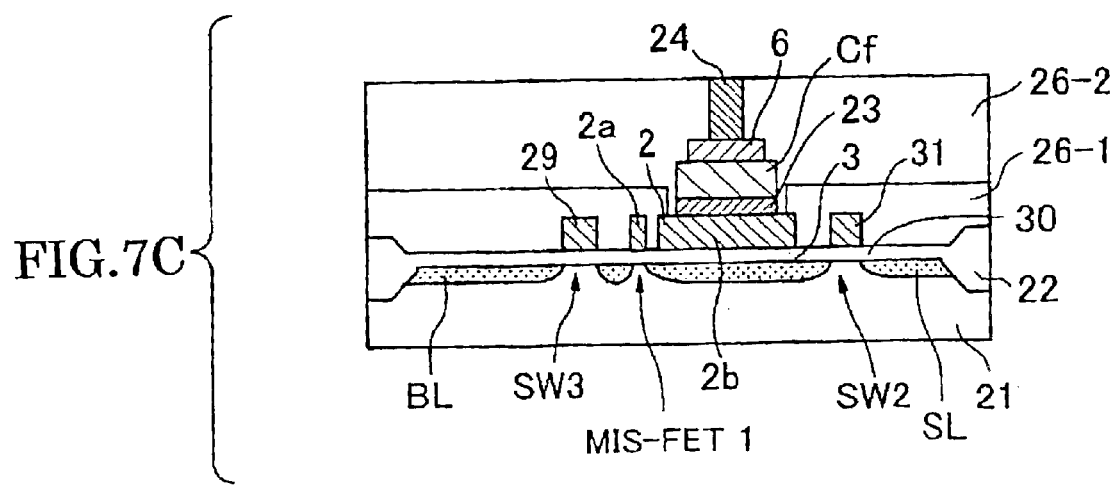

FIGS. 7A to 7C show another embodiment of the invention. The same elements as those shown in FIGS. 6A to 6C are denoted by the same reference characters and not described. FIG. 7A is a sectional view taken along line a—a' in the plan view in FIG. 7B. FIG. 7C is a sectional view taken along line c—c' in the plan view in FIG. 7B. According to the embodiment shown in FIGS. 7A to 7C, the ferroelectric capacitor Cf is directly placed on the paraelectric capacitor 3. The floating gate electrode 2 partly lies on the element isolation region, and the ferroelectric thin film of the ferroelectric capacitor Cf and the upper electrode 6 are provided mainly on the part of the paraelectric capacitor 3 that overlaps the source region 4 rather than the element isolation region. Therefore, similarly to the structure as shown in FIGS. 6A to 6C, the area of the ferroelectric capacitor Cf relative to the paraelectric capacitor 3 can be reduced, and the coupling ratio can be increased. In this way, a sufficiently large share of voltage can be distributed to the ferroelectric capacitor Cf, and sufficiently large polarization can be provided to the ferroelectrics at the time of writing data.

Figure 8A:
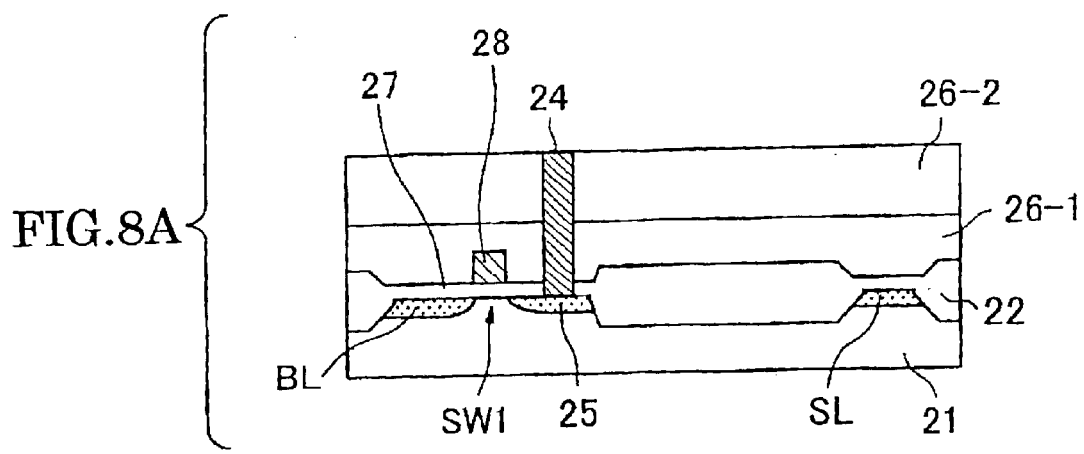
FIGS. 8A to 8C show the memory cell in the schematic representation in FIG. 2 according to another embodiment of the invention, FIGS. 8A and 8C being sectional views and FIG. 8B being a plan view.
Figure 8B:
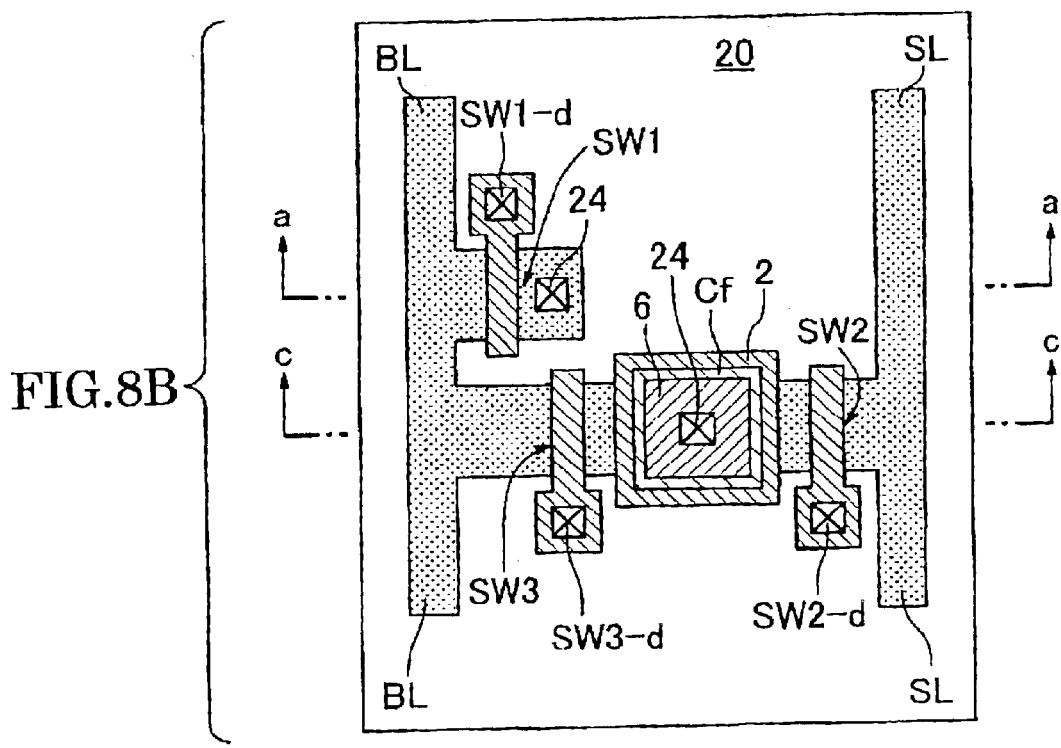
Figure 8C:
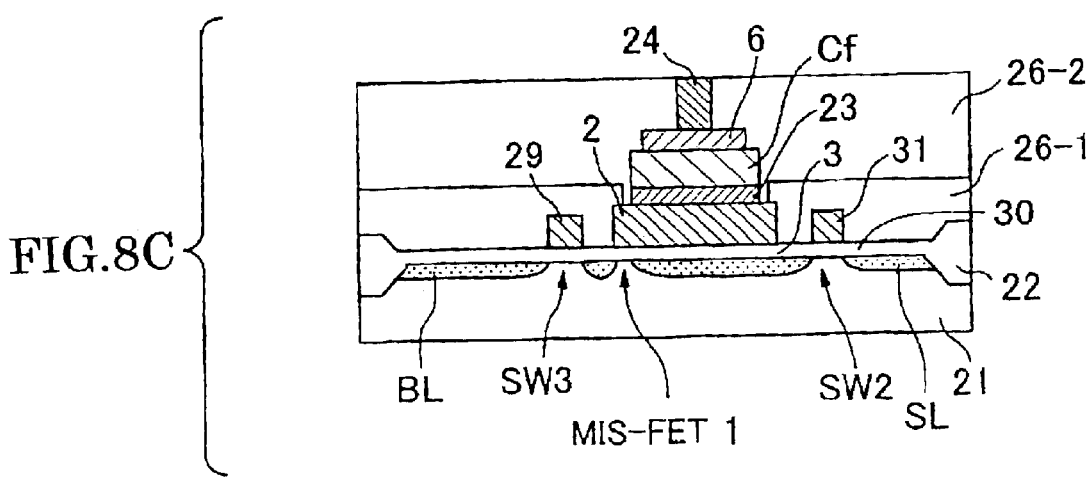

FIGS. 8A to 8C are diagrams showing another embodiment of the invention. The same elements as those shown in FIGS. 6A to 6C are denoted by the same reference characters and not described. FIG. 8A is a sectional view taken along line a—a' in the plan view in FIG. 8B. FIG. 8C is a sectional view taken along line c—c' in the plan view in FIG. 8B. According to the embodiment shown in FIGS. 8A to 8C, the ferroelectric capacitor Cf is directly placed on the floating gate electrode 2 on the paraelectric capacitor 3, the channel region of the data detection MIS-FET 1, and on the source diffusion layer. The floating gate electrode 2 partly lies on the element isolation region. Since the ferroelectric thin film of the ferroelectric capacitor Cf and the upper electrode 6 are provided on the channel region and the paraelectric capacitor 3 rather than on the element isolation region, the area of the ferroelectric capacitor Cf relative to the paraelectric capacitor 3 can be smaller than those in FIGS. 6A to 6C and 7A to 7C. This allows the coupling ratio to be increased, and a sufficient large share of voltage can be distributed to the ferroelectric capacitor Cf, so that sufficient polarization can be provided to the ferroelectrics at the time of data writing.

Figure 9:
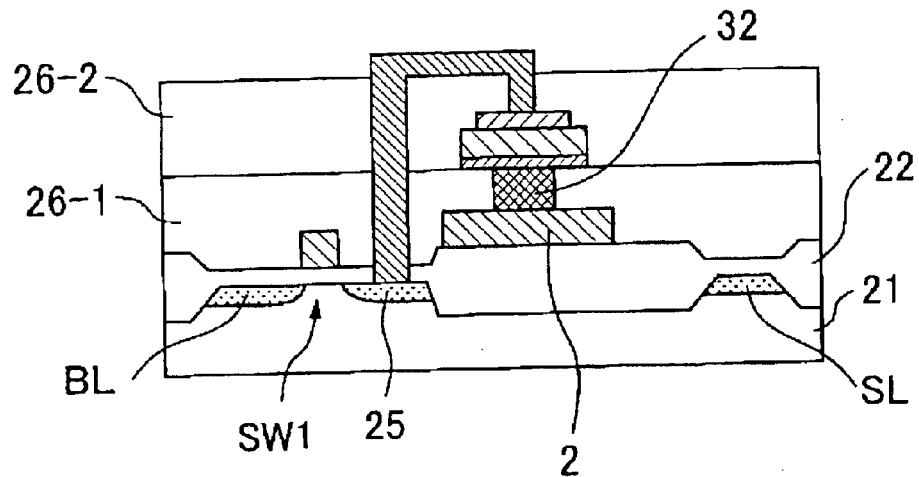
FIG. 9 is a sectional view of the memory cell in the schematic representation in FIG. 6A according to another embodiment of the invention.
Figure 10:
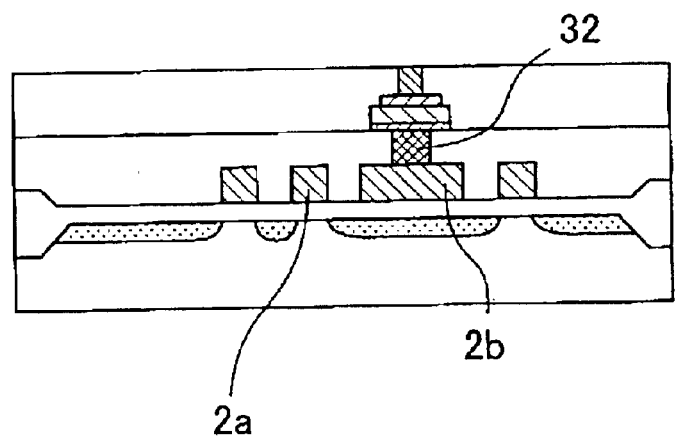
FIG. 10 is a sectional view of the memory cell in the schematic representation in FIG. 7C according to another embodiment of the invention.
Figure 11:
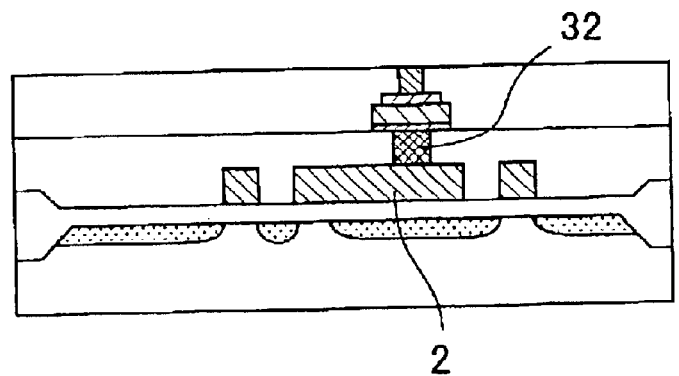
FIG. 11 is a sectional view of the memory cell in the schematic representation in FIG. 8C according to another embodiment of the invention.

In FIGS. 6A, 7C, and 8C, the ferroelectric capacitor may be connected through a conductive film 32 as shown in FIGS. 9, 10, and 11 rather than being provided directly on the floating gate. Similarly to the arrangements in these figures, the area of the ferroelectric capacitor Cf relative to the paraelectric capacitor 3 can be reduced, the coupling ratio can be increased, a sufficiently large share of voltage can be distributed to the ferroelectric capacitor Cf and sufficient polarization can be provided to the ferroelectrics at the time of writing data. Furthermore, when the ferroelectric capacitor is formed, the detection MIS-FET has already been covered with an insulating layer and protected, and therefore the MIS-FET is kept from being contaminated with residue after processing the ferroelectric capacitor or a material in the ferroelectrics diffused by heat treatment, so that and good transistor characteristics can be provided.

Figure 12:
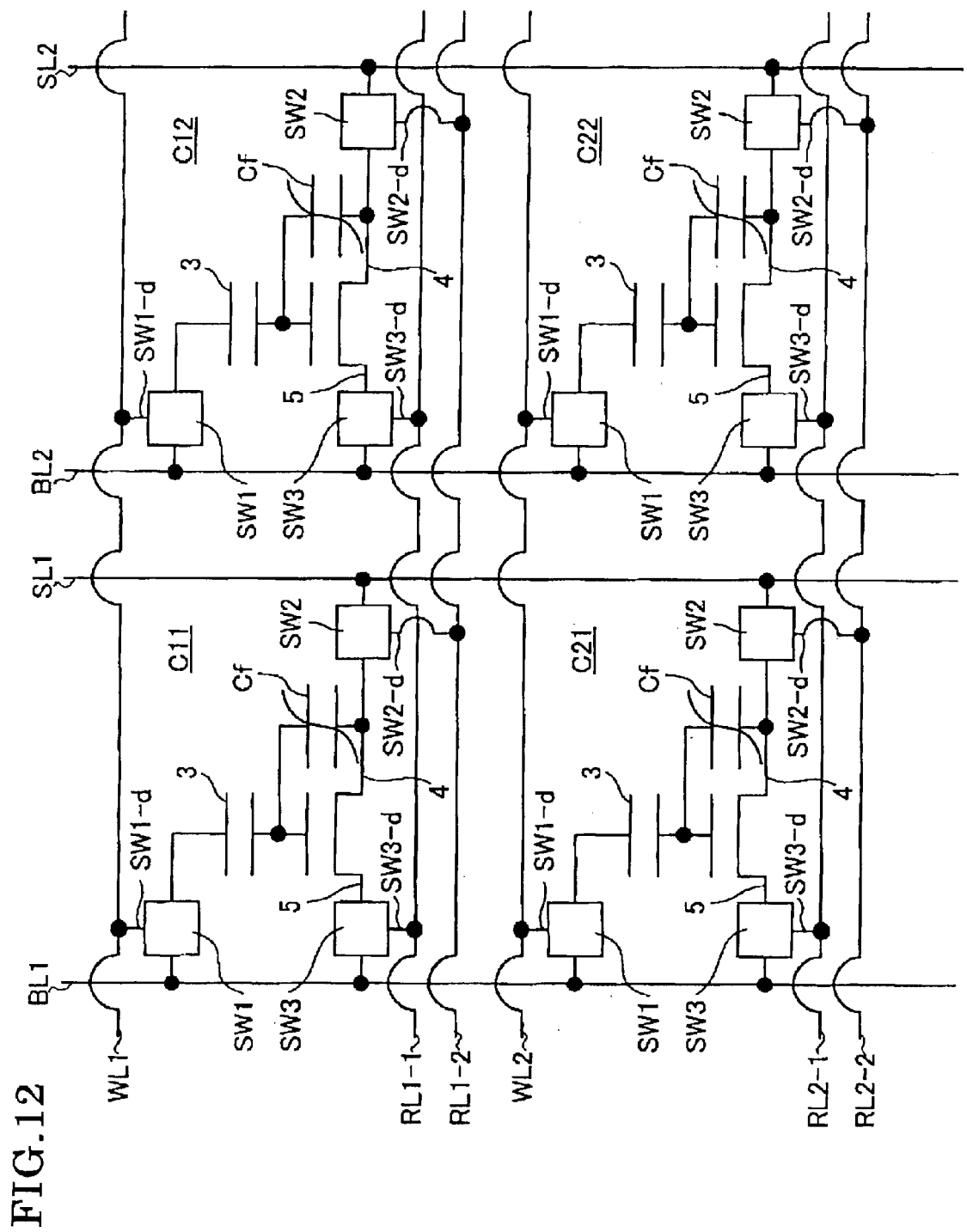
FIG. 12 is a schematic diagram of the ferroelectric non-volatile memory cells corresponding to those in FIG. 3 arranged in a matrix according to another embodiment of the invention.
Figure 13:
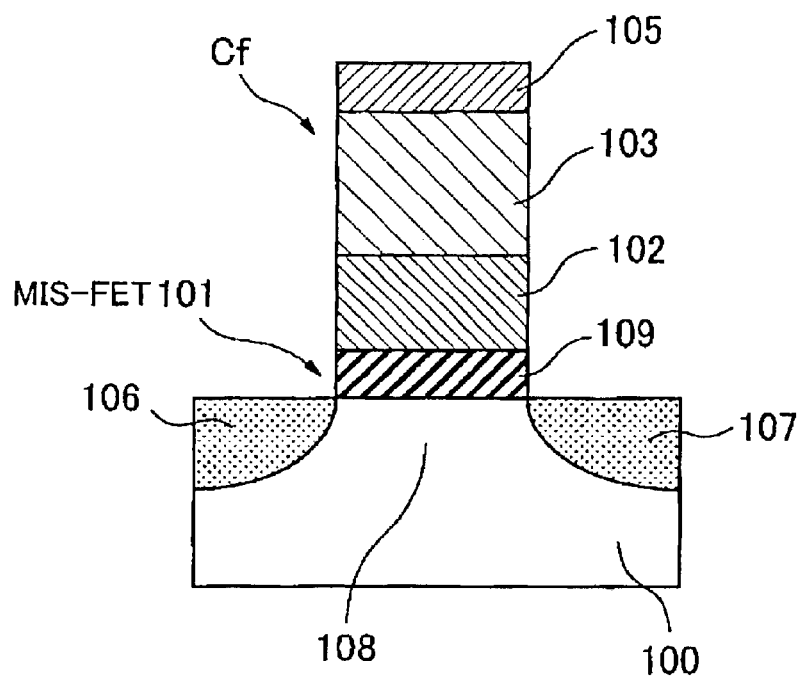
FIG. 13 is a sectional view of a conventional MFMIS-FET.
Figure 14:
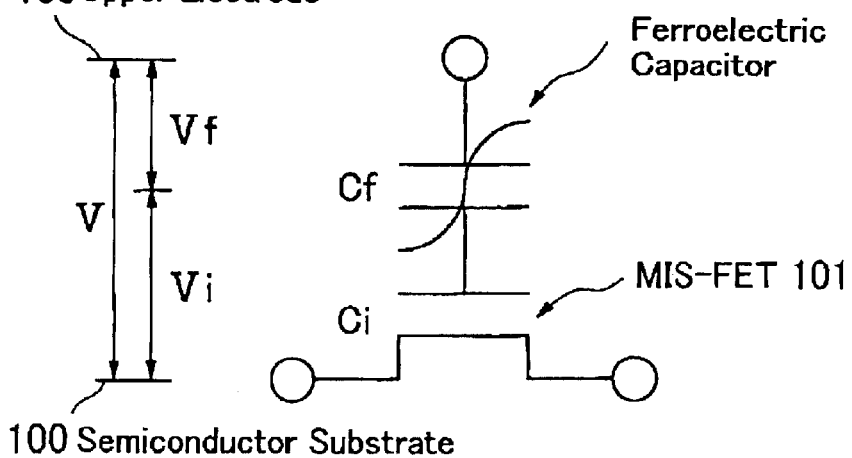
FIG. 14 is an equivalent circuit diagram of a conventional MFMIS-FET.
Figure 15:
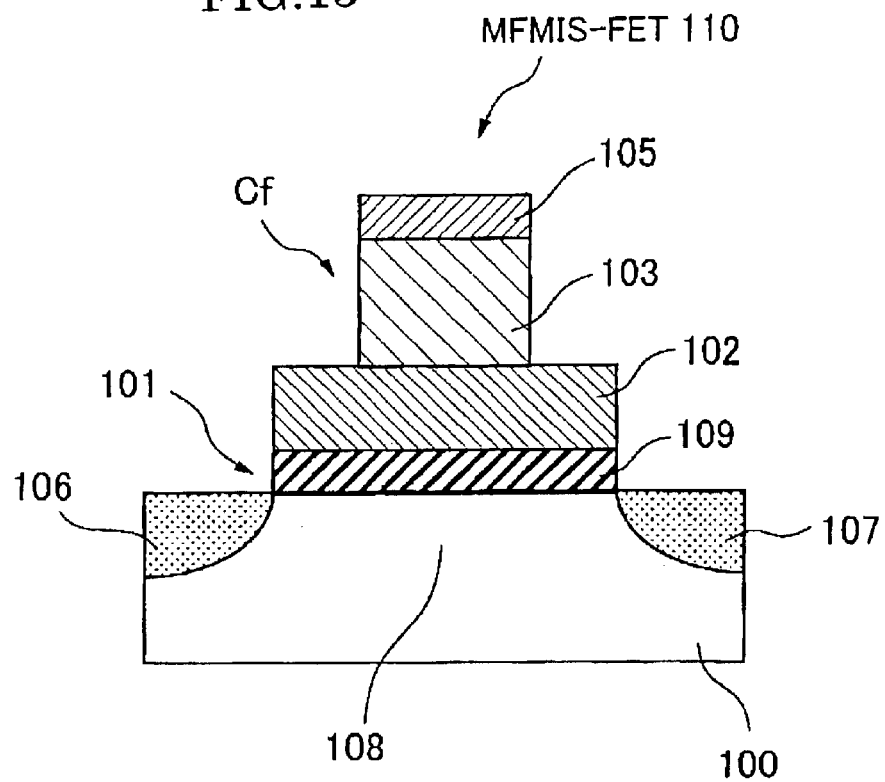
FIG. 15 is a sectional view of another conventional MFMIS-FET.
Figure 16:
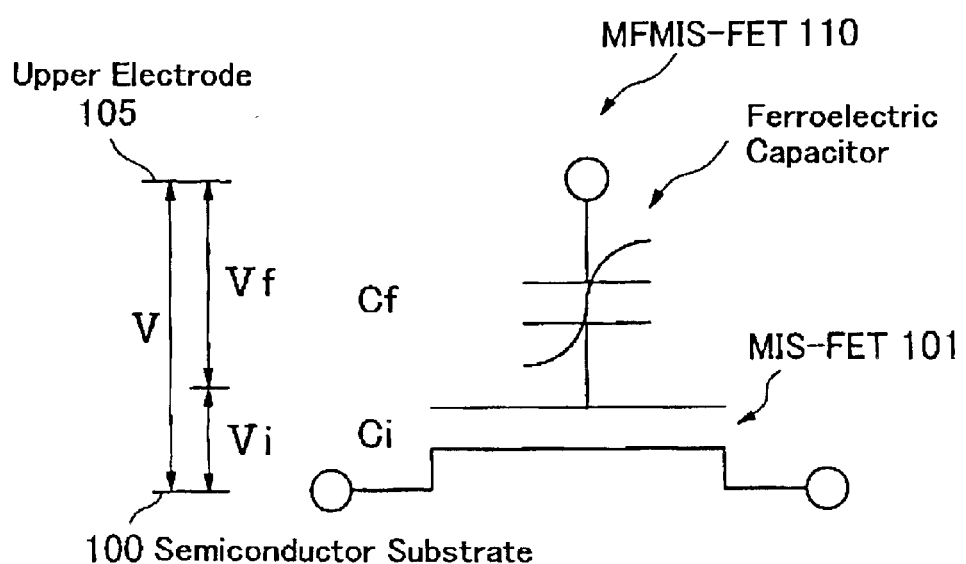
FIG. 16 is an equivalent circuit diagram of another conventional MFMIS-FET.
Figure 17:
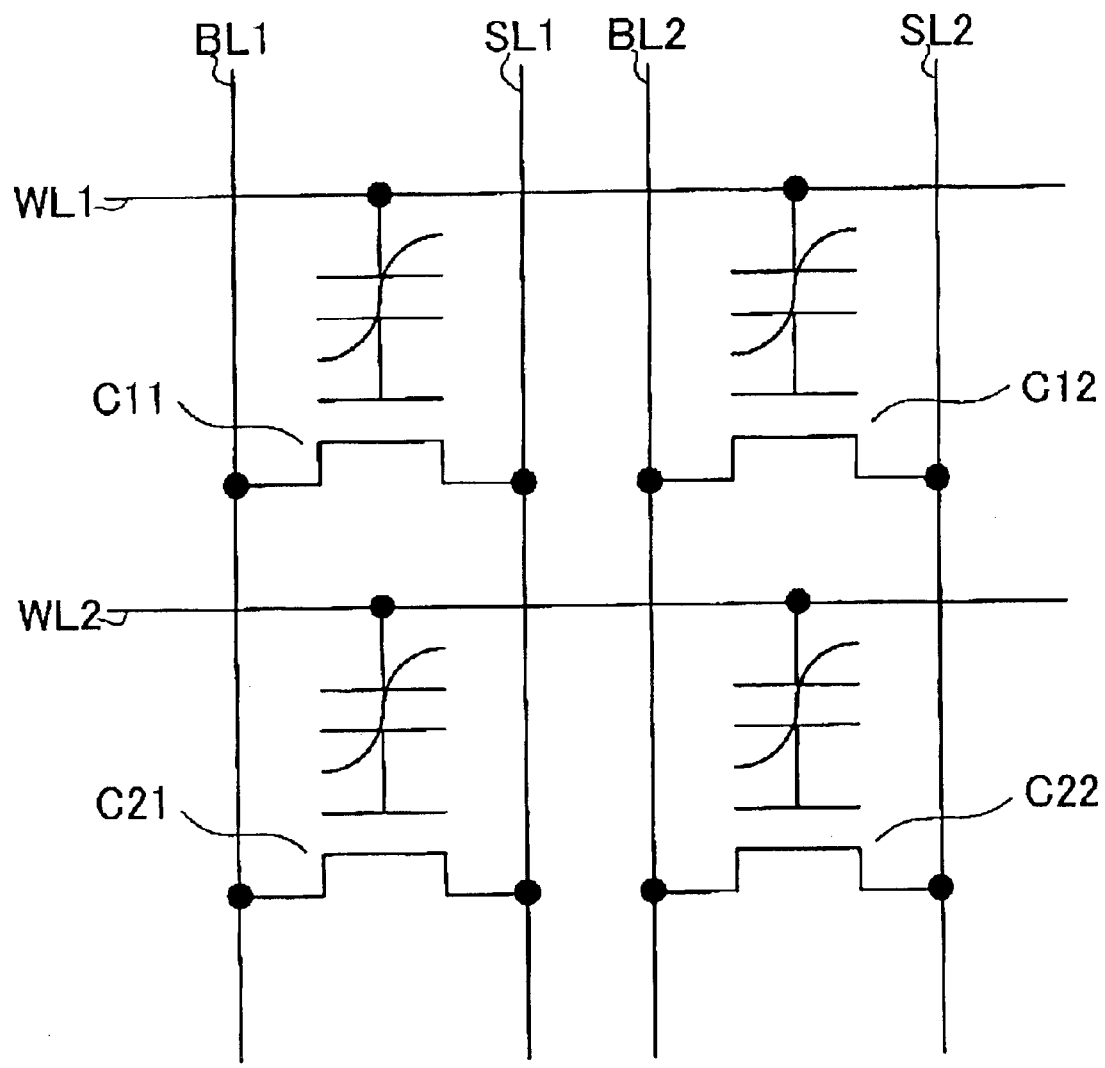
FIG. 17 is a circuit diagram of a ferroelectric non-volatile memory device including a conventional MFMIS-FET.

According to the above-described embodiments, particularly those shown in FIGS. 1 to 5, the first capacitor is a ferroelectric capacitor and the second capacitor is a paraelectric capacitor. However, they can be the other way around. The first capacitor may be a paraelectric capacitor, the second capacitor may be a ferroelectric capacitor, and still the same effects as those according to the embodiments shown in FIGS. 1 to 5 are brought about though not detailed. When they are reversed in this way in the ferroelectric non-volatile memory device as shown in FIG. 3, the arrangement as shown in FIG. 12 results. In FIG. 12, the same elements as those in FIG. 3 are denoted by the same reference characters and not described. In this case, the switching elements operate to write, erase and read in the same manner as those shown in FIG. 5.

Although the invention has been described by referring to the embodiments, the invention is by no means limited by them. For example, the positive program voltage Vp may be varied rather than being equal as described. It should be understood that material of the gate insulating film for the MIS-FET, the material of the insulating film for the paraelectric capacitor, the material of the ferroelectrics. The conductor may be changed or combined differently, or the arrangement of the switching elements or the ferroelectric capacitor and the detection MIS-FET may be changed. The switching element may be a mechanical switch, and still the same effects can be provided. The semiconductor substrate maybe an SOI (Silicon On Insulator) substrate, and then a memory device with reduced power consumption can be produced.

According to the invention, writing, erasing, and reading data to/from an arbitrary memory cell does not affect the other memory cells, and therefore highly reliable non-volatile memory can be provided. The voltage can have the same polarity, and therefore a negative voltage generation circuit or means for generating negative voltage provided outside the chip is not necessary. Therefore, the chip area can be reduced and higher density integration can be achieved. In addition, according to the invention, the effect of distributing voltage to the ferroelectric capacitor can be improved, so that the stability in holding data can be improved. Furthermore, the structure to thus improve the effect of voltage distribution can be formed through normal processes while unwanted increase in the area is restricted as much as possible.

What is claimed is:

1. A ferroelectric non-volatile memory device, comprising at least a memory cell including:
   first and second capacitors each having one electrode connected with one electrode of the other capacitor; at a connection node; and
   a MIS-FET having a gate electrode connected with the connection node of said first and second capacitors and a source region connected with another electrode of said second capacitor, said gate electrode being formed as a floating gate, wherein
   one of said first and second capacitors is a ferroelectric capacitor, another one of said first and second capacitors is a paraelectric capacitor, and
   said one electrode of said capacitor is integrally formed with said gate electrode so as to overlap a part of said source region excluding a boundary between a channel region and said source region of said MIS-FET, and said another electrode of said second capacitor is made of said source region.

2. A ferroelectric non-volatile memory device, comprising at least a memory cell including:
   first and second capacitors each having one electrode connected with one electrode of the other capacitor at a connection node; and
   a MIS-FET having a gate electrode connected with the connection node of said first and second capacitors and a source region connected with another electrode of said second capacitor, said gate electrode being formed as a floating gate; and
   an insulating layer covering said gate electrode and said one electrode of said second capacitor; wherein
   said first capacitor is a ferroelectric capacitor,
   said second capacitor is a paraelectric capacitor,
   said one electrode of said second capacitor is integrally formed with said gate electrode so as to overlap a part of said source region,
   said another electrode of said second capacitor is made of said source region, and
   said first capacitor is formed on said second capacitor, said one terminals are connected at said connection node by a conductor and interposed between said first and second capacitors.

3. A ferroelectric non-volatile memory device, comprising at least a memory cell including:
   first and second capacitors each having one electrode connected with one electrode of the other capacitor at a connection node; and
   a MIS-FET having a gate electrode connected with the connection node of said first and second capacitors and a source region connected with another electrode of said second capacitor, said gate electrode being formed as a floating gate;
   a source line connected to said source region;
   a bit line connected to a drain region of said MIS-FET and another electrode of said first capacitor;
   a writing switching element connecting said bit line and said another electrode of said first capacitor;
   an erasure switching element connecting said source line to said another electrode of said second capacitor and said source region;
   a reading switching element connecting said bit line and said drain region, and
   one of said first and second capacitors being a ferroelectric capacitor, the other capacitor being a paraelectric capacitor.

4. A method of driving the ferroelectric non-volatile memory device according to claim 3, comprising the steps of:
applying a positive electric potential to said bit line;
bringing said source line to a zero electric potential;
turning on said erasure switching element in said memory cell to which data is to be written; and
turning on said writing switching element in said memory cell to which data is to be written, thereby writing data to said memory cell.

5. A method of driving the ferroelectric non-volatile memory device according to claim 3, comprising the steps of:
bringing said bit line to a zero electric potential;
applying a positive electric potential to said source line;
turning on said erasure switching element in said memory cell from which data is to be erased; and
turning on said writing switching element in said memory cell from which data is to be erased, thereby erasing the data from said memory cell.

6. A method of driving the ferroelectric non-volatile memory device according to claim 3, comprising the steps of:
applying voltage at a positive electric potential to said bit line;
bringing said source line to a zero electric potential voltage level;
turning on said erasure switching element in said memory cell from which data is to be read out; and
turning on said reading switching element in said memory cell from which data is to be read out, thereby reading out the data from said memory cell.

7. The ferroelectric non-volatile memory device according to claim 3, wherein;
said at least a memory cell include a plurality of memory cells arranged in a matrix of m rows and n columns where m and n are both an integer equal to 2 or more, said device comprises:
m word lines arranged in the row direction for driving said writing switching element;
n bit lines and n source lines arranged in the column direction,
m first lines arranged in the row direction for driving said reading switching element; and
m second lines arranged in the row direction for driving said erasure switching element.

8. The ferroelectric non-volatile memory device according to any one of claims 1 to 3, wherein a capacitance value of said paraelectric capacitor is equal to or greater than a capacitance value of said ferroelectric capacitor.

9. The ferroelectric non-volatile memory device according to any one of claims 1 to 3, wherein:
said first capacitor is a ferroelectric capacitor, said second capacitor is a paraelectric capacitor,
said one electrode of said second capacitor is integrally formed with said gate electrode so as to overlap a part of said source region,
said another electrode of said second capacitor is made of said source region,
said one electrode of said second capacitor is partly on an element isolation region, and
said first capacitor is formed on said second capacitor and in the region of said second capacitor overlapping said element isolation region.

10. The ferroelectric non-volatile memory device according to any one of claims 1 to 3, wherein
said first capacitor is a ferroelectric capacitor,
said second capacitor is a paraelectric capacitor,
said one electrode of said second capacitor is integrally formed with said gate electrode so as to overlap a part of an element isolation region and a part of said source region, said another electrode of said second capacitor is made of said source region, and
said first capacitor is formed on the second capacitor and on said source region in the region overlapping said second capacitor.

11. The ferroelectric non-volatile memory device according to any one of claims 2, and 3, wherein
said first capacitor is a ferroelectric capacitor,
said second capacitor is a paraelectric capacitor,
said one electrode of said second capacitor is formed integrally with said gate electrode by a conductor layer formed along an area from above a channel region of said MIS-FET to an area above said source region, said another electrode of said second capacitor is made of said source region, and
said first capacitor is provided on said conductor layer and in a region overlapping the conductive layer.

12. A ferroelectric non-volatile memory device accordingly to claim 2, wherein the conductor connecting the first and second capacitors penetrates through the insulating layer.

13. A ferroelectric non-volatile memory device accordingly to claim 1, further comprising:
an insulating layer covering said gate electrode and said one electrode of said second capacitor; and
said one terminals are connected at said connection node by a conductor;
wherein the conductor connecting the first and second capacitors penetrates through the insulating layer.

14. A ferroelectric non-volatile memory device, comprising at least a memory cell including:
first and second capacitors each having one electrode connected with one electrode of the other capacitor at a connection node; and
a MIS-FET having a gate electrode connected with the connection node of said first and second capacitors and a source region connected with another electrode of said second capacitor, said gate electrode being formed as a floating gate;
a source line connected to said source region;
a bit line connected to a drain region of said MIS-FET and another electrode of said first capacitor;
an erasure switching element connecting said source line to said another electrode of said second capacitor and said source region;
a reading switching element connecting said bit line and said drain region, and
one of said first and second capacitors being a ferroelectric capacitor, the other capacitor being a paraelectric capacitor.

15. A ferroelectric non-volatile memory device, comprising at least a memory cell including:
first and second capacitors each having one electrode connected with one electrode of the other capacitor at a connection node; and
a MIS-FET having a gate electrode connected with the connection node of said first and second capacitors and a source region connected with another electrode of said second capacitor, said gate electrode being formed as a floating gate;

a source line connected to said source region;

a bit line connected to a drain region of said MIS-FET and another electrode of said first capacitor;

a writing switching element connecting said bit line and said another electrode of said first capacitor;

a reading switching element connecting said bit line and said drain region, and one of said first and second capacitors being a ferroelectric capacitor, the other capacitor being a paraelectric capacitor.

16. A ferroelectric non-volatile memory device, comprising at least a memory cell including:

first and second capacitors each having one electrode connected with one electrode of the other capacitor at a connection node; and a MIS-FET having a gate electrode connected with the connection node of said first and second capacitors and a source region connected with another electrode of said second capacitor, said gate electrode being formed as a floating gate;

a source line connected to said source region;

a bit line connected to a drain region of said MIS-FET and another electrode of said first capacitor;

a writing switching element connecting said bit line and said another electrode of said first capacitor;

an erasure switching element connecting said source line to said another electrode of said second capacitor and said source region; and one of said first and second capacitors being a ferroelectric capacitor, the other capacitor being a paraelectric capacitor.

* * * * *